US012713158B2

(12) United States Patent
Maehashi

(10) Patent No.: US 12,713,158 B2
(45) Date of Patent: Aug. 18, 2026

(54) PHOTOELECTRIC CONVERSION DEVICE AND OPTICAL DETECTION SYSTEM

(71) Applicant: CANON KABUSHIKI KAISHA, Tokyo (JP)

(72) Inventor: Yu Maehashi, Hokkaido (JP)

(73) Assignee: Canon Kabushiki Kaisha, Tokyo (JP)

(*) Notice: Subject to any disclaimer, the term of this patent is extended or adjusted under 35 U.S.C. 154(b) by 102 days.

(21) Appl. No.: 18/761,033

(22) Filed: Jul. 1, 2024

(65) Prior Publication Data

US 2024/0357259 A1 Oct. 24, 2024

Related U.S. Application Data

(63) Continuation of application No. PCT/JP2022/000057, filed on Jan. 5, 2022.

(51) Int. Cl.

| | |
|---|---|
| ***H04N 25/773*** | (2023.01) |
| ***H04N 25/705*** | (2023.01) |
| ***H04N 25/709*** | (2023.01) |
| ***H04N 25/76*** | (2023.01) |
| ***H04N 25/766*** | (2023.01) |

(Continued)

(52) U.S. Cl.

CPC ......... *H04N 25/773* (2023.01); *H04N 25/705* (2023.01); *H04N 25/709* (2023.01); *H04N 25/766* (2023.01); *H04N 25/7795* (2023.01); *H04N 25/79* (2023.01); *H10F 39/80377* (2025.01)

(58) Field of Classification Search

CPC .. H04N 25/773; H04N 25/705; H04N 25/709; H04N 25/766; H04N 25/7795; H04N 25/79; H10F 39/80377

See application file for complete search history.

(56) References Cited

U.S. PATENT DOCUMENTS

| | | | | |
|---|---|---|---|---|
| 11,743,613 B2 * | 8/2023 | Maehashi | ............ | H04N 25/709 348/207.99 |
| 2017/0069673 A1 | 3/2017 | Ikeda | | |
| 2019/0327424 A1 * | 10/2019 | Sasaki | .................. | H04N 25/773 |

(Continued)

FOREIGN PATENT DOCUMENTS

| | | |
|---|---|---|
| JP | 2019158806 A | 9/2019 |
| JP | 2020028081 A | 2/2020 |

(Continued)

*Primary Examiner* — Albert H Cutler

(74) *Attorney, Agent, or Firm* — Canon U.S.A., Inc. IP Division

(57) ABSTRACT

A photoelectric conversion device includes a plurality of pixels each including a photoelectric conversion unit configured to output a signal based on incidence of a photon, the photoelectric conversion unit including an avalanche photodiode configured to multiply a charge resulting from the incidence of the photon by avalanche multiplication, a processing circuit configured to process the signal output from the photoelectric conversion unit, and a pixel output circuit configured to control output of a signal processed by the processing circuit; a data line connected to the plurality of pixels; and a reception circuit configured to receive a pixel signal output from the plurality of pixels via the data line. An off-leakage current of a transistor constituting the reception circuit is lower than that of a transistor constituting the pixel output circuit.

17 Claims, 20 Drawing Sheets

(51) Int. Cl.

| | |
|---|---|
| ***H04N 25/79*** | (2023.01) |
| ***H10F 39/00*** | (2025.01) |

(56) References Cited

U.S. PATENT DOCUMENTS

| | | | | |
|---|---|---|---|---|
| 2020/0358972 | A1* | 11/2020 | Suzuki | H04N 25/575 |
| 2021/0151481 | A1 | 5/2021 | Maehashi | |
| 2021/0151486 | A1* | 5/2021 | Kobayashi | H04N 25/00 |
| 2022/0155153 | A1* | 5/2022 | Zhu | H10F 39/807 |

FOREIGN PATENT DOCUMENTS

| | | | |
|---|---|---|---|
| JP | 2021082973 | A | 5/2021 |
| JP | 2021083112 | A | 5/2021 |

* cited by examiner

FIG.5A
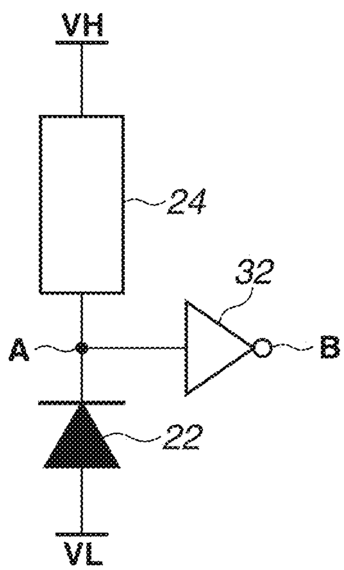
FIG.5B
FIG.5C
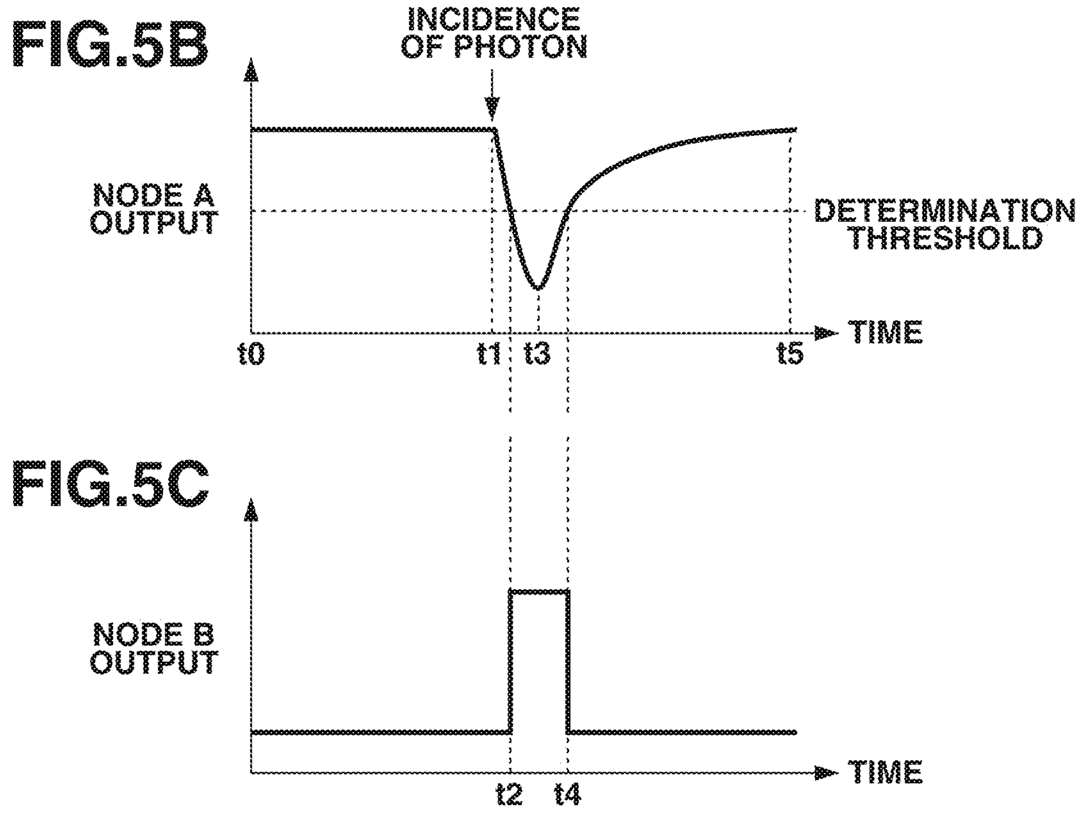

FIG.7

10
12
16
16A
16B
18
22
24
32
34
36
50
52
56
58
MN21
MP22
MP23
Vdd
MN12A
MN11A
MN12B
MN11B
P_RES
P_SEL
VH
VL

Low illuminance environment

High illuminance environment

200
EXTERNAL I/F UNIT
212
COMPUTER
BUFFER MEMORY UNIT
210
RECORDING MEDIUM CONTROL I/F UNIT
216
RECORDING MEDIUM
214
SIGNAL PROCESSING UNIT
208
OVERALL CONTROL AND CALCULATION UNIT
218
TIMING GENERATION UNIT
220
PHOTOELECTRIC CONVERSION DEVICE
201
DIAPHRAGM
204
202
206

LIGHT SOURCE DEVICE
320
300
310
MEMORY
308
MONITOR
306
IMAGE PROCESSING CIRCUIT
304
PHOTOELECTRIC CONVERSION DEVICE
302
330
OBJECT

PHOTOELECTRIC CONVERSION DEVICE AND OPTICAL DETECTION SYSTEM

CROSS-REFERENCE TO RELATED APPLICATIONS

This application is a Continuation of International Patent Application No. PCT/JP2022/000057, filed Jan. 5, 2022, which is hereby incorporated by reference herein in its entirety.

BACKGROUND OF THE INVENTION

Field of the Invention

The present invention relates to a photoelectric conversion device and an optical detection system.

Background Art

Single photon avalanche diodes (SPADs) are known as detectors capable of detecting light as weak as a single photon. SPADs multiply signal charges excited by a photon about several to several million times using an avalanche multiplication phenomenon caused by a strong electric field induced at a semiconductor pn junction. The number of incident photons can be directly measured by converting the current caused by the avalanche multiplication phenomenon into a pulse signal and counting the number of pulse signals. Patent Literature 1 discusses a photoelectric conversion device including a two-dimensional array of pixels each including an avalanche photodiode.

CITATION LIST

Patent Literature

PTL 1: Japanese Patent Laid-Open No. 2019-158806

Image sensors using SPADs include a large number of constituent elements per pixel compared to ones not using an SPAD, and various functional blocks are included in each pixel. These functional blocks desirably have characteristics corresponding to their functionality, but element design taking into consideration the characteristics of each functional block has not been made so far. As a result, functionality enhancement and a reduction in the power consumption of SPAD-based photoelectric conversion devices have not necessarily been sufficient.

SUMMARY OF THE INVENTION

The present invention is directed to providing a technique for further enhancing the functionality and reducing the power consumption of a photoelectric conversion device and an optical detection system.

According to an aspect of the present invention, a photoelectric conversion device includes a plurality of pixels each including a photoelectric conversion unit configured to output a signal based on incidence of a photon, the photoelectric conversion unit including an avalanche photodiode configured to multiply a charge resulting from the incidence of the photon by avalanche multiplication, a processing circuit configured to process the signal output from the photoelectric conversion unit, and a pixel output circuit configured to control output of a signal processed by the processing circuit; a data line connected to the plurality of pixels; and a reception circuit configured to receive a pixel signal output from the plurality of pixels via the data line, wherein an off-leakage current of a first transistor constituting the reception circuit is lower than that of a second transistor constituting the pixel output circuit.

According to another aspect of the present invention, a photoelectric conversion device includes a plurality of pixels each including a photoelectric conversion unit configured to output a signal based on incidence of a photon, the photoelectric conversion unit including an avalanche photodiode configured to multiply a charge resulting from the incidence of the photon by avalanche multiplication, a processing circuit configured to process the signal output from the photoelectric conversion unit, and a pixel output circuit configured to control output of a signal processed by the processing circuit; a data line connected to the plurality of pixels; and a reception circuit configured to receive a pixel signal output from the plurality of pixels via the data line, wherein an impurity concentration of a channel region of a first transistor constituting the reception circuit is a first concentration, the channel region containing an impurity of a same conductivity type as that of the first transistor, and wherein an impurity concentration of a channel region of a second transistor constituting the pixel output circuit is a second concentration lower than the first concentration, the channel region containing an impurity of a same conductivity type as that of the second transistor.

Further features of the present invention will become apparent from the following description of exemplary embodiments with reference to the attached drawings.

BRIEF DESCRIPTION OF THE DRAWINGS

FIGS. 5A to 5C are diagrams for describing a basic operation of a photoelectric conversion unit in the photoelectric conversion device according to the first exemplary embodiment of the present invention.

FIG. 7 is a circuit diagram illustrating a configuration example of a pixel output circuit and a reset circuit in the photoelectric conversion device according to the first exemplary embodiment of the present invention.

DESCRIPTION OF THE EMBODIMENTS

Figure 1:
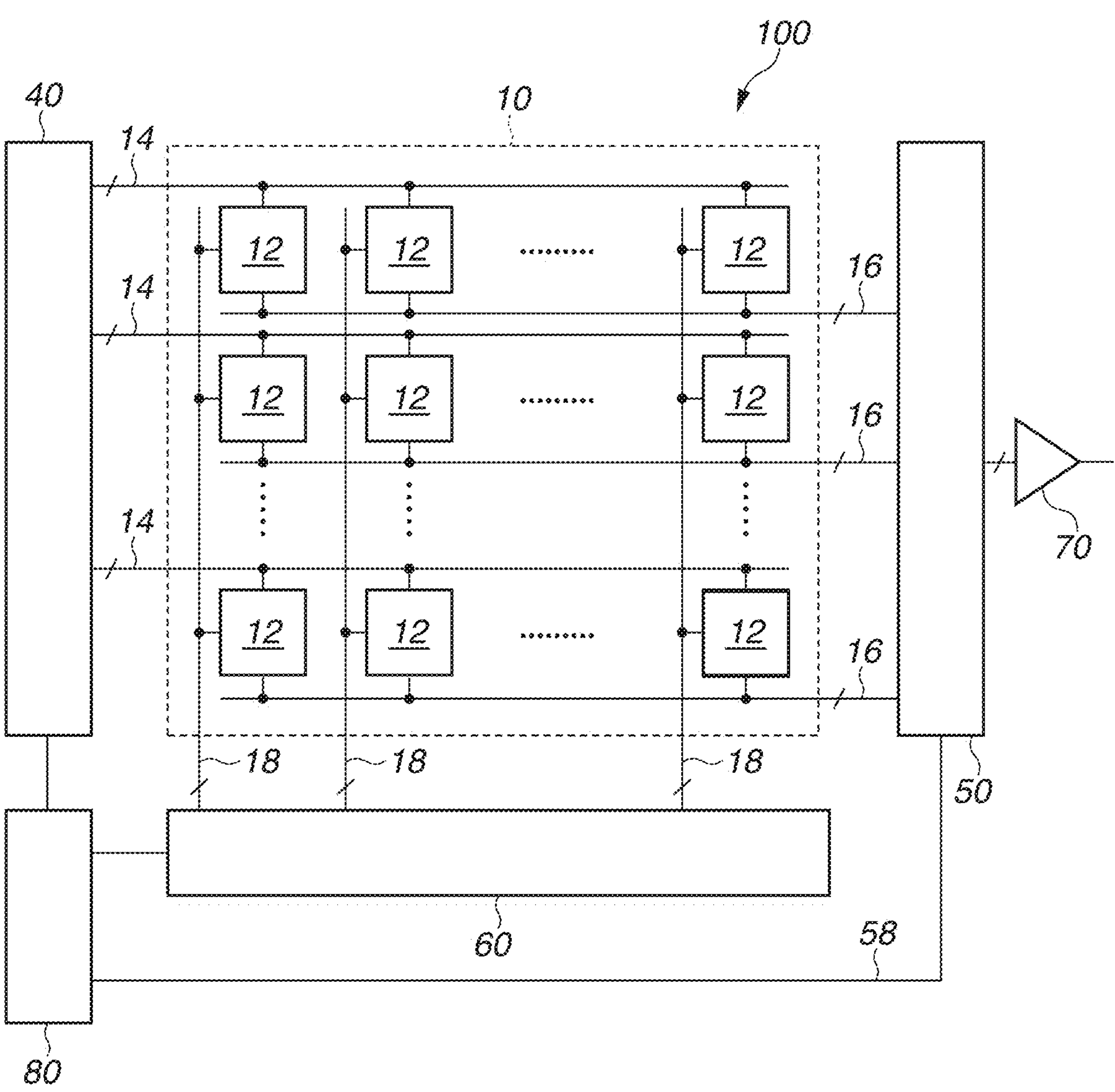
FIG. 1 is a block diagram (1) illustrating a schematic configuration of a photoelectric conversion device according to a first exemplary embodiment of the present invention.

Exemplary embodiments to be described below are intended to embody the technical concept of the present invention and not limit the present invention. The sizes and positional relationships of members illustrated in the drawings may be exaggerated for the clarity of description.

First Embodiment

Figure 2:
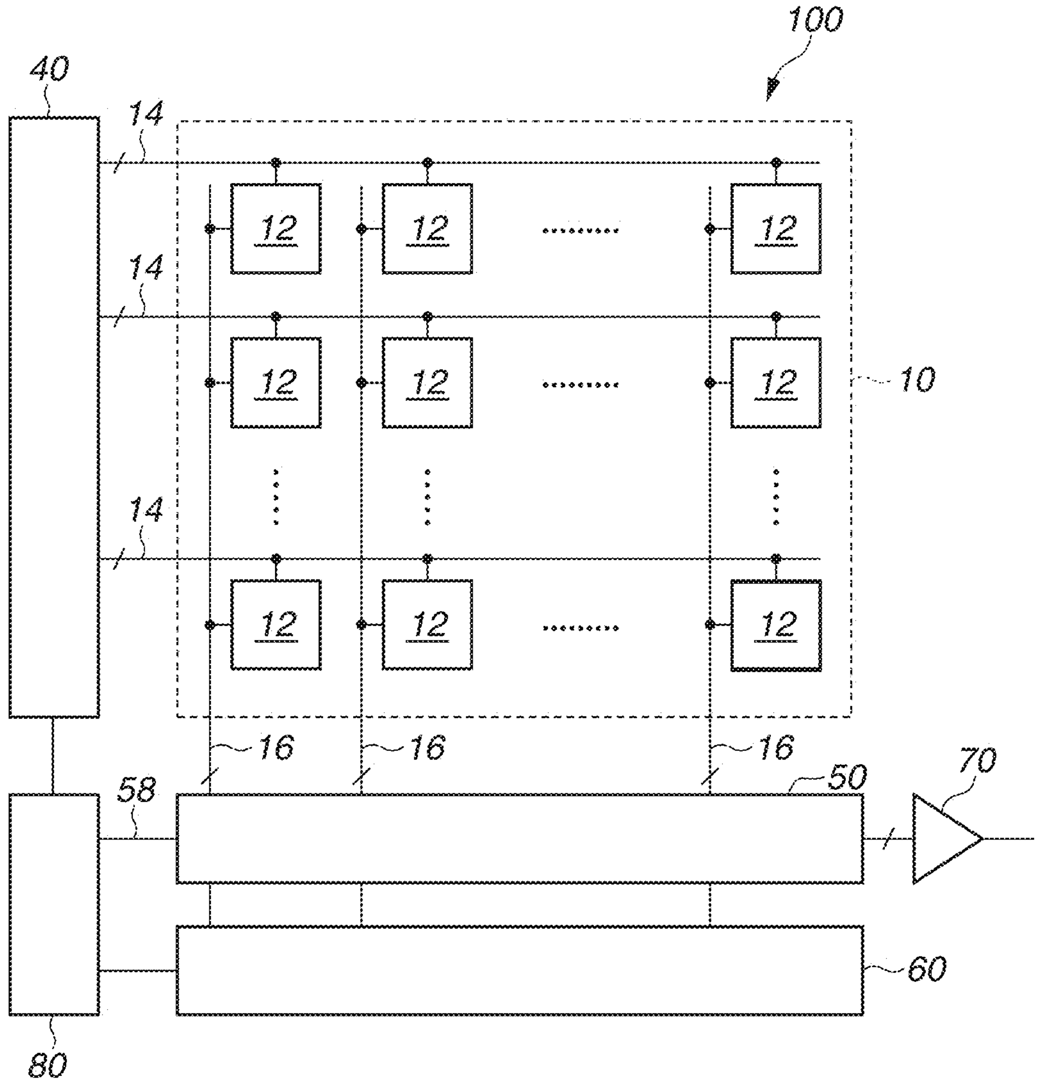
FIG. 2 is a block diagram (2) illustrating a schematic configuration of the photoelectric conversion device according to the first exemplary embodiment of the present invention.
Figure 3:
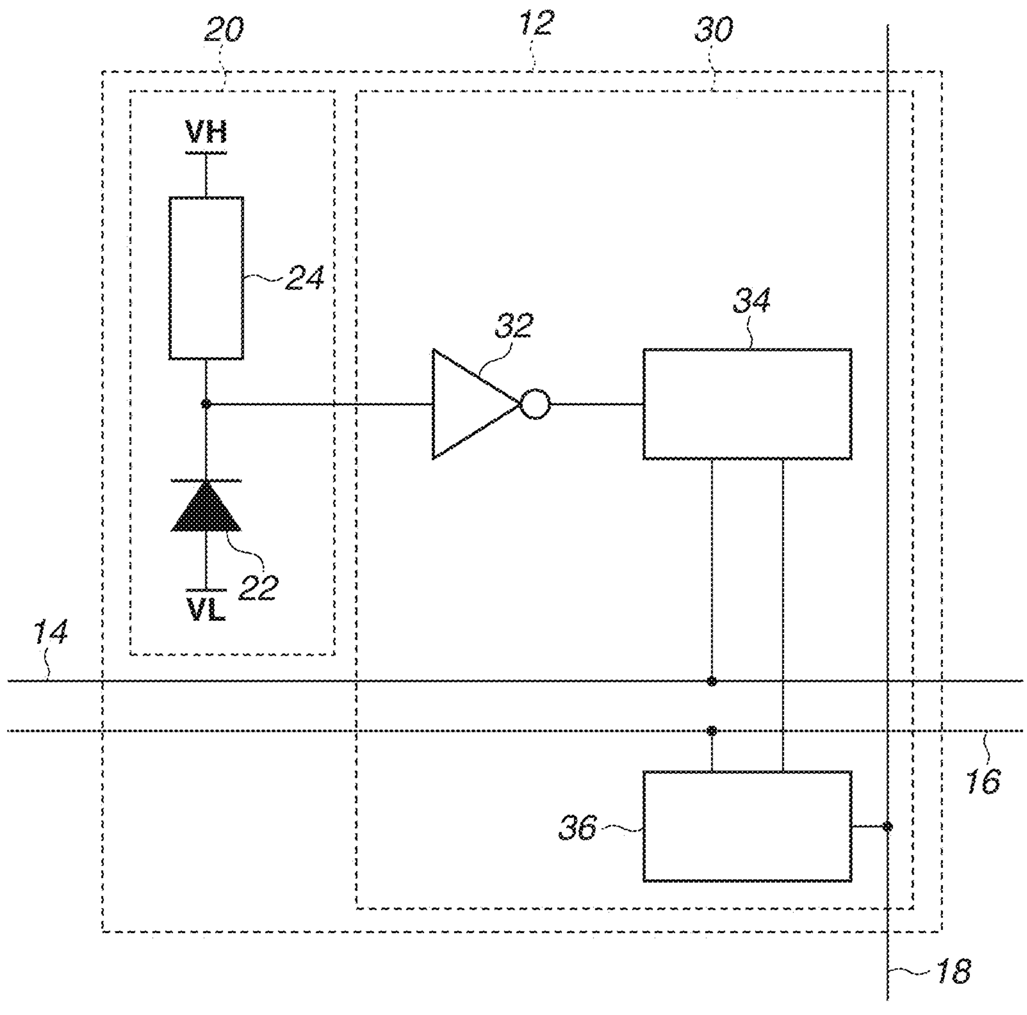
FIG. 3 is a block diagram illustrating a configuration example of a pixel in the photoelectric conversion device according to the first exemplary embodiment of the present invention.
Figure 4:
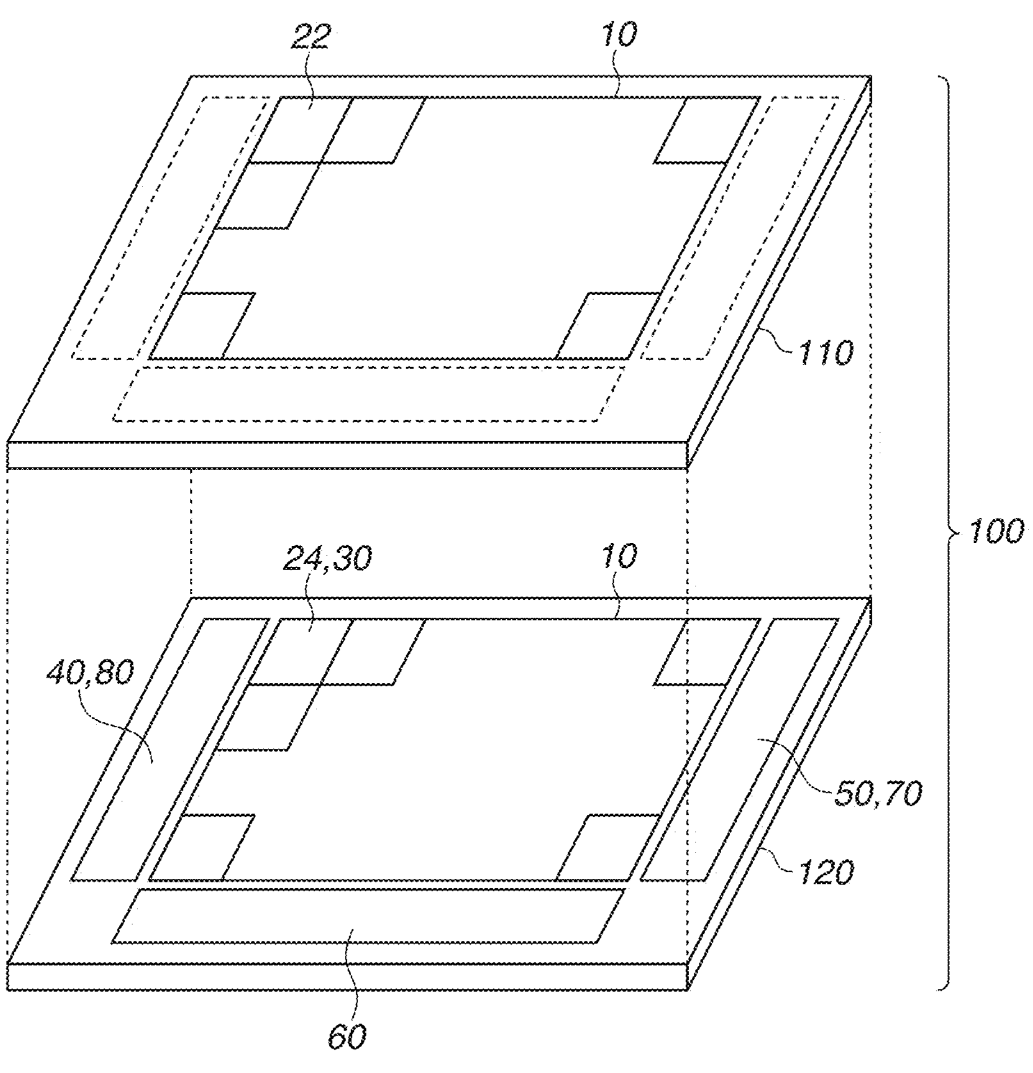
FIG. 4 is a perspective view illustrating a configuration example of the photoelectric conversion device according to the first exemplary embodiment of the present invention.
Figure 6:
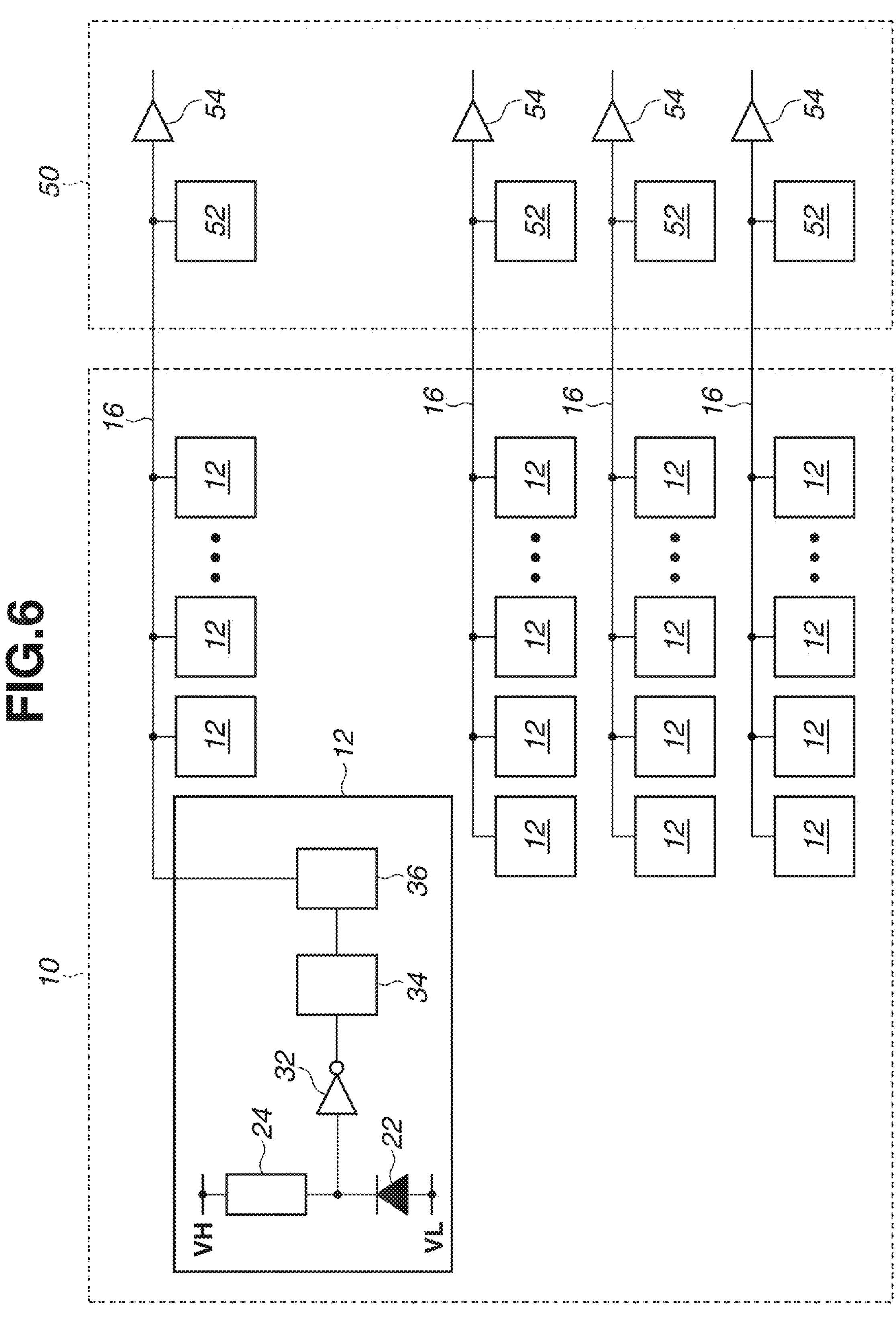
FIG. 6 is a diagram illustrating an outline of connection between a pixel unit and a reading circuit unit of the photoelectric conversion device according to the first exemplary embodiment of the present invention.
Figure 7:
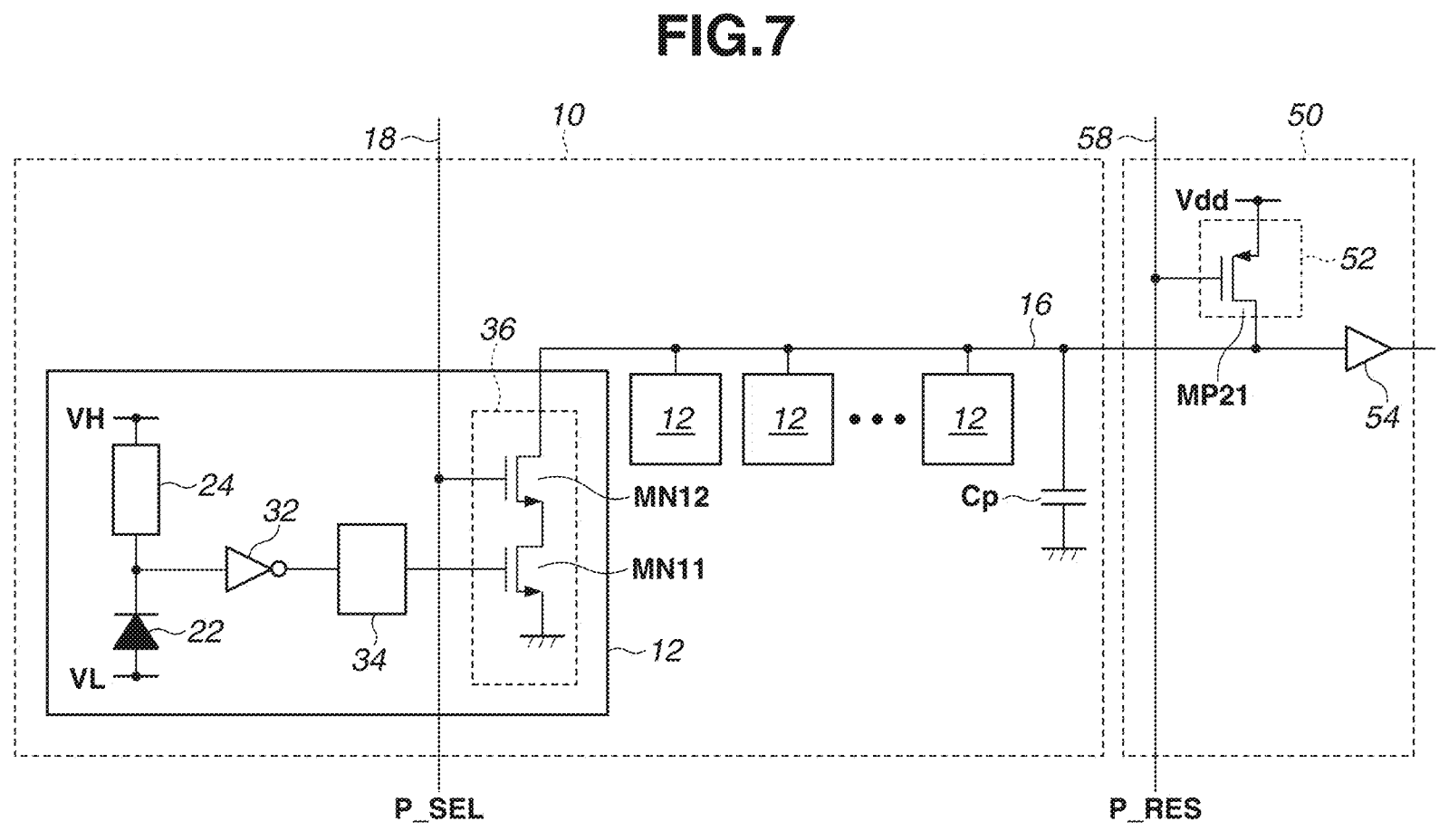

A photoelectric conversion device according to a first exemplary embodiment of the present invention will be described with reference to FIGS. 1 to 8F. FIGS. 1 and 2 are block diagrams illustrating schematic configurations of the photoelectric conversion device according to the present exemplary embodiment. FIG. 3 is a block diagram illustrating a configuration example of a pixel in the photoelectric conversion device according to the present exemplary embodiment. FIG. 4 is a perspective view illustrating a configuration example of the photoelectric conversion device according to the present exemplary embodiment. FIGS. 5A to 5C are diagrams for describing a basic operation of a photoelectric conversion unit in the photoelectric conversion device according to the present exemplary embodiment. FIG. 6 is a diagram illustrating an outline of connection between a pixel unit and a reading circuit unit of the photoelectric conversion device according to the present exemplary embodiment. FIG. 7 is a circuit diagram illustrating a configuration example of a pixel output circuit and a reset circuit in the photoelectric conversion device according to the present exemplary embodiment. FIGS. 8A to 8F are diagrams for describing how to control a threshold voltage of a metal-oxide-semiconductor (MOS) transistor.

As illustrated in FIG. 1, a photoelectric conversion device 100 according to the present exemplary embodiment includes a pixel unit 10, a vertical scanning circuit unit 40, a reading circuit unit 50, a horizontal scanning circuit unit 60, an output circuit unit 70, and a control pulse generation unit 80.

The pixel unit 10 includes a plurality of pixels 12 arranged in an array with a plurality of rows and a plurality of columns. As will be described below, each pixel 12 can include a photoelectric conversion unit including a photon detection element, and a pixel signal processing unit for processing a signal output from the photoelectric conversion unit. The number of pixels 12 constituting the pixel unit 10 is not limited in particular. For example, like a typical digital camera, the pixel unit 10 can include a plurality of pixels 12 arranged in an array with several thousands of rows×several thousands of columns. Alternatively, the pixel unit 10 may be composed of a plurality of pixels 12 arranged in a row or column. Alternatively, the pixel unit 10 may be constituted by a single pixel 12.

Each row of the pixel array of the pixel unit 10 includes a control line 14 extending in a first direction (in FIG. 1, lateral direction). The control line 14 is connected to each of the pixels 12 arranged in the first direction, and serves as a common signal line for the pixels 12. The first direction in which the control line 14 extends may be referred to as a row direction or a horizontal direction. Each control line 14 can include a plurality of signal lines for supplying a plurality of types of control signals to the pixels 12. The control line 14 in each row is connected to the vertical scanning circuit unit 40.

Each row of the pixel array of the pixel unit 10 includes a data line 16 extending in the first direction. The data line 16 is connected to each of the pixels 12 arranged in the first direction, and serves as a common signal line for the pixels 12. Each data line 16 can include a plurality of signal lines for transferring a plurality of bits of digital signal output from the pixels 12 bit by bit. The data line 16 in each row is connected to the reading circuit unit 50.

Each column of the pixel array of the pixel unit 10 includes a control line 18 extending in a second direction (in FIG. 1, vertical direction) intersecting the first direction. The control line 18 is connected to each of the pixels 12 arranged in the second direction, and serves as a common signal line for the pixels 12. The second direction in which the control line 18 extends may be referred to as a column direction or a perpendicular direction. Each control line 18 can include a plurality of signal lines for supplying a plurality of types of control signals to the pixels 12. The control line 18 in each column is connected to the horizontal scanning circuit unit 60.

The vertical scanning circuit unit 40 is a control unit having a function of receiving control signals output from the control pulse generation unit 80, generating control signals for driving the pixels 12, and supplying the generated control signals to the pixels 12 via the control lines 14. A logic circuit such as a shift register and an address decoder can be used as the vertical scanning circuit unit 40. The vertical scanning circuit unit 40 sequentially supplies the control signals to the pixels 12 of the pixel unit 10 row by row, whereby the pixels 12 of the pixel unit 10 are sequentially driven row by row.

The horizontal scanning circuit unit 60 is a control unit having a function of receiving control signals output from the control pulse generation unit 80, generating control signals for driving the pixels 12, and supplying the generated control signals to the pixels 12 via the control lines 18. A logic circuit such as a shift register and an address decoder can be used as the horizontal scanning circuit unit 60. The horizontal scanning circuit unit 60 sequentially scans the pixels 12 in the pixel unit 10 column by column, whereby the pixel signals held in the pixels 12 are output to the reading circuit unit 50 via the data lines 16.

The reading circuit unit 50 includes a plurality of determination circuits and a plurality of holding units (not illustrated) provided corresponding to the respective rows of the pixel array of the pixel unit 10. The reading circuit unit 50 has a function of holding the pixel signals of each column of pixels 12 output from the pixel unit 10 via the data lines 16 row by row into the holding units of the corresponding rows. The reading circuit unit 50 receives a control signal supplied from the control pulse generation unit 80 via a control line 58, and sequentially outputs the pixel signals held in the holding units of the respective rows to the output circuit unit 70.

The output circuit unit 70 is a circuit unit that includes an external interface circuit and is intended to output the pixel signals output from the reading circuit unit 50 to outside the photoelectric conversion device 100. The external interface circuit included in the output circuit unit 70 is not limited in particular. For example, a low voltage differential signaling (LVDS) circuit or a scalable low voltage signaling (SLVS) circuit can be applied as the external interface circuit. In other words, a serializer/deserializer (SerDes) transmission circuit can be applied as the external interface circuit.

The control pulse generation unit 80 is a control circuit that is intended to generate the control signals for controlling the operation and timing of the vertical scanning circuit unit 40, the reading circuit unit 50, and the horizontal scanning circuit unit 60, and supply the control signals to the functional blocks. At least some of the control signals for controlling the operation and timing of the vertical scanning circuit unit 40, the reading circuit unit 50, and the horizontal scanning circuit unit 60 may be supplied from outside the photoelectric conversion device 100.

The connection mode of the functional blocks of the photoelectric conversion device 100 is not limited to the configuration example of FIG. 1. For example, the photoelectric conversion device 100 may be configured as illustrated in FIG. 2.

In the configuration example of FIG. 2, each column of the pixel array of the pixel unit 10 includes a data line 16 extending in the second direction. The data line 16 is connected to each of the pixels 12 arranged in the second direction, and serves as a common signal line for the pixels 12. The data line 16 in each column is connected to the reading circuit unit 50.

The reading circuit unit 50 is a reception circuit for receiving the pixel signals output via the data lines 16, and has a function of holding the pixel signals of the respective columns of pixels 12 output from the pixel unit 10 via the data lines 16 row by row into the holding units of the corresponding columns. The reading circuit unit 50 includes a plurality of determination circuits and the plurality of holding units (not illustrated) provided corresponding to the respective columns of the pixel array of the pixel unit 10.

The horizontal scanning circuit unit 60 receives the control signals output from the control pulse generation unit 80, generates control signals for reading the pixel signals from the holding units of the respective columns in the reading circuit unit 50, and supplies the generated control signals to the reading circuit unit 50. The horizontal scanning circuit unit 60 sequentially scans the holding units of the respective columns in the reading circuit unit 50, and sequentially outputs the pixel signals held in the respective holding units to the output circuit unit 70.

The other functional blocks in the configuration example of FIG. 2 can be the same as those in the configuration example of FIG. 1.

As illustrated in FIG. 3, each pixel 12 includes a photoelectric conversion unit 20 and a pixel signal processing unit 30. The photoelectric conversion unit 20 includes a photon detection element 22 and a quenching element 24. The pixel signal processing unit 30 includes a waveform shaping circuit 32, a processing circuit 34, and a pixel output circuit 36.

The photon detection element 22 can be an avalanche photodiode (APD). The anode of the APD constituting the photon detection element 22 is connected to a node to which a voltage VL is supplied. The cathode of the APD constituting the photon detection element 22 is connected to one terminal of the quenching element 24. The connection node between the photon detection element 22 and the quenching element 24 serves as an output node of the photoelectric conversion unit 20. The other terminal of the quenching element 24 is connected to a node to which a voltage VH higher than the voltage VL is supplied. The voltages VL and VH are set so that a reverse bias voltage sufficient for the APD to cause an avalanche multiplication operation is applied. For example, a negative high voltage is supplied as the voltage VL, and a positive voltage about as high as a power supply voltage is supplied as the voltage VH. For example, the voltage VL is −30 V, and the voltage VH is 1 V.

As described above, the photon detection element 22 can be constituted by an APD. With a reverse bias voltage sufficient to cause an avalanche multiplication operation applied, charges resulting from the incidence of light on the APD cause avalanche multiplication, and an avalanche current occurs. There are two operation modes where a reverse bias voltage is applied to the APD: a Geiger mode and a linear mode. The Geiger mode is an operation mode where the voltage applied across the anode and the cathode is a reverse bias voltage higher than the breakdown voltage of the APD. The linear mode is an operation mode where the voltage applied across the anode and the cathode is a reverse bias voltage near the breakdown voltage of the APD or lower than or equal to the breakdown voltage. APDs operating in the Geiger mode are referred to as single photon avalanche diodes (SPADs). The APD constituting the photon detection element 22 may operate in the linear mode or the Geiger mode. In particular, SPADs can exhibit a high potential difference and a pronounced withstanding effect compared to APDs in the linear mode.

The quenching element 24 has a function of converting a change in the avalanche current occurring from the photon detection element 22 into a voltage signal. The quenching element 24 also has a function of serving as a load circuit (quenching circuit) in multiplying a signal by avalanche multiplication, and thereby reducing the voltage applied to the photon detection element 22 to suppress the avalanche multiplication. The operation of the quenching element 24 suppressing avalanche multiplication is referred to as a quenching operation. The quenching element 24 has a function of restoring the voltage supplied to the photon detection element 22 to the voltage VH by passing a current as much as the voltage drop caused by the quenching operation. The operation of the quenching element 24 restoring the voltage supplied to the photon detection element 22 to the voltage VH is referred to as a recharging operation. The quenching element 24 can be constituted by a resistive element or a MOS transistor.

The waveform shaping circuit 32 includes an input node to which the output signal of the photoelectric conversion unit 20 is supplied, and an output node. The waveform shaping circuit 32 has a function of converting an analog signal supplied from the photoelectric conversion unit 20 into a pulse signal. The waveform shaping circuit 32 can be constituted by a logic circuit including a NOT circuit (inverter circuit), a NOR circuit, or a NAND circuit. The output node of the waveform shaping circuit 32 is connected to the processing circuit 34.

The processing circuit 34 includes an input node to which the output signal of the waveform shaping circuit 32 is supplied, an input node that is connected to the control line 14, and an output node. The processing circuit 34 is a functional block for performing predetermined processing on the pulse signal output from the waveform shaping circuit 32. An example of the processing circuit 34 is a counter. If the processing circuit 34 is a counter, the processing circuit 34 can have a function of counting pulses superposed on the signal output from the waveform shaping circuit 32 and holding a count that is the counting result. The signals supplied from the vertical scanning circuit unit 40 to the processing circuit 34 via the control line 14 can include an enable signal for controlling the pulse counting period (exposure period) and a reset signal for resetting the count held in the processing circuit 34. The output node of the processing circuit 34 is connected to the data line 16 via the pixel output circuit 36.

The pixel output circuit 36 has a function of switching an electrical connection state (connection or disconnection) between the processing circuit 34 and the data line 16. The pixel output circuit 36 switches the connection state between the processing circuit 34 and the data line 16 based on a control signal supplied from the horizontal scanning circuit unit 60 via the control line 18 (in the configuration example of FIG. 2, a control signal supplied from the vertical scanning circuit unit 40 via the control line 14). The pixel output circuit 36 can include a buffer circuit for outputting a signal.

The pixel 12 is typically a unit structure that outputs a pixel signal for forming an image. However, if time-of-flight (ToF) ranging is intended, the pixel 12 does not necessarily need to be a unit structure that outputs a pixel signal for forming an image. More specifically, the pixel 12 may be a unit structure that outputs a signal for measuring the time of arrival and the amount of light.

The pixel signal processing unit 30 does not necessarily need to be provided for each pixel 12 on a one-on-one basis. A pixel signal processing unit 30 may be provided for a plurality of pixels 12. In such a case, the signal processing of the plurality of pixels 12 can be sequentially performed using the one pixel signal processing unit 30.

The photoelectric conversion device 100 according to the present exemplary embodiment may be formed on a single substrate, or configured as a stacked photoelectric conversion device including a plurality of substrates stacked on each other. In the latter case, for example, as illustrated in FIG. 4, a sensor substrate 110 and a circuit substrate 120 can be stacked and electrically connected to constitute the stacked photoelectric conversion device. Of the components of the pixels 12, at least the photon detection elements 22 can be disposed on the sensor substrate 110. Of the components of the pixels 12, the quenching elements 24 and the pixel signal processing units 30 can be disposed on the circuit substrate 120. The photon detection elements 22, the quenching elements 24, and the pixel signal processing units 30 are electrically connected via connection wiring provided for each pixel 12. The vertical scanning circuit unit 40, the reading circuit unit 50, the horizontal scanning circuit unit 60, the output circuit unit 70, and the control pulse generation unit 80 can also be disposed on the circuit substrate 120.

The photon detection element 22, the quenching element 24, and the pixel signal processing unit 30 of each pixel 12 are disposed on the sensor substrate 110 and the circuit substrate 120 to overlap in a plan view. The vertical scanning circuit unit 40, the reading circuit unit 50, the horizontal scanning circuit unit 60, the output circuit unit 70, and the control pulse generation unit 80 can be located around the pixel unit 10 including the plurality of pixels 12. As employed herein, a "plan view" refers to a view in a direction perpendicular to the light incident surface of the sensor substrate 110.

The stacked configuration of the photoelectric conversion device 100 can increase the degree of integration of the elements for enhanced functionality. In particular, since the photon detection elements 22 are disposed on a substrate different from that of the quenching elements 24 and the pixel signal processing units 30, the photon detection elements 22 can be densely arranged without sacrificing the light receiving area of the photon detection elements 22, whereby the photon detection efficiency can be improved.

The number of substrates constituting the photoelectric conversion device 100 is not limited to two. Three or more substrates may be stacked to constitute the photoelectric conversion device 100.

In FIG. 4, diced chips are assumed as the sensor substrate 110 and the circuit substrate 120. However, the sensor substrate 110 and the circuit substrate 120 are not limited to chips. For example, the sensor substrate 110 and the circuit substrate 120 may be a wafer each. The sensor substrate 110 and the circuit substrate 120 may be stacked in a wafer state and then diced, or diced into respective chips and then stacked and bonded.

FIGS. 5A to 5C are diagrams for describing a basic operation of the photoelectric conversion unit 20 and the waveform shaping circuit 32. FIG. 5A is a circuit diagram of the photoelectric conversion unit 20 and the waveform shaping circuit 32. FIG. 5B illustrates a signal waveform at the input node (node A) of the waveform shaping circuit 32. FIG. 5C illustrates a signal waveform at the output node (node B) of the waveform shaping circuit 32.

At time t0, a reverse bias voltage equivalent to a potential difference (VH-VL) is applied to the photon detection element 22. The reverse bias voltage applied across the anode and cathode of the APD constituting the photon detection element 22 is sufficient to cause avalanche multiplication, but without a photon incident on the photon detection element 22, there is no carrier to trigger the avalanche multiplication. The photon detection element 22 therefore does not cause avalanche multiplication, and no current flows through the photon detection element 22.

Suppose that a photon is incident on the photon detection element 22 at the subsequent time t1. The incidence of the photon on the photon detection element 22 generates an electron-hole pair through photoelectric conversion. These carriers trigger avalanche multiplication, and an avalanche multiplication current flows through the photon detection element 22. This avalanche multiplication current flows through the quenching element 24 to cause a voltage drop across the quenching element 24, and the voltage at the node A starts to drop. The amount of voltage drop at the node A increases, and once the avalanche multiplication stops at time t3, the voltage level of the node A does not drop any further.

With the avalanche multiplication in the photon detection element 22 stopped, a current to compensate for the voltage drop flows from the node to which the voltage VL is supplied to the node A via the photon detection element 22, and the voltage of the node A increases gradually. At time t5, the node A settles at its original voltage level.

The waveform shaping circuit 32 binarizes the signal input from the node A based on a predetermined determination threshold, and outputs the resulting signal from the node B. Specifically, if the voltage level of the node A exceeds the determination threshold, the waveform shaping circuit 32 outputs a low-level signal from the node B. If the voltage level of the node A is lower than or equal to the determination threshold, the waveform shaping circuit 32 outputs a high-level signal from the node B. Suppose, for example, that the voltage of the node A is lower than or equal to the determination threshold during the period from time t2 to time t4 as illustrated in FIG. 5B. In such a case, as illustrated in FIG. 5C, the signal level of the node B is low during the period from time t0 to time t2 and the period from the time t4 to time t5, and becomes high during the period from time t2 to time t4.

The waveform of the analog signal input from the node A is thus shaped into a digital signal by the waveform shaping circuit 32. The pulse signal output from the waveform shaping circuit 32 based on the incidence of the photon on the photon detection element 22 is a photon detection pulse signal.

If the processing circuit 34 constitutes a counter, the processing circuit 34 counts photon detection pulse signals thus output from the waveform shaping circuit 32, and holds the count as a digital signal. The pixel output circuit 36 outputs the digital signal (pixel signal) held in the processing circuit 34 to the data line 16 based on the control signal supplied from the horizontal scanning circuit unit 60 via the control line 18.

FIG. 6 is a diagram illustrating an outline of connection between the pixel unit 10 and the reading circuit unit 50. FIG. 6 illustrates a connection relationship when the configuration example of FIG. 1 is employed. In the case of the configuration example of FIG. 2, the rows and columns are interchanged, but the connection relationship is basically the same. A description thereof will thus be omitted.

As described above, the pixel unit 10 includes the plurality of pixels 12 arranged in a plurality of rows and a plurality of columns. In FIG. 6, the internal circuit of only the top left pixel 12 is illustrated for the simplicity of the diagram. The other pixels 12 also have the same configuration. Each row of the pixel array includes a data line 16 laid in the row direction. While FIG. 6 illustrates one signal line for each row as the data line 16, the pixel signal output from the pixel 12 is a digital signal, and the data line 16 in each row includes a plurality of signal lines corresponding to the number of bits of the pixel signal.

The reading circuit unit 50 can include reset circuits 52 and determination circuits 54 connected to the respective data lines 16. Although not illustrated in FIG. 6, the reading circuit unit 50 includes a plurality of reset circuits 52 and a plurality of determination circuits 54 corresponding to the number of bits of the pixel signal for each row of the pixel array. Memories (not illustrated) for storing information "0" or "1" corresponding to the determination results of the determination circuits 54 are provided at the subsequent stage of the determination circuits 54.

FIG. 7 is a circuit diagram illustrating a configuration example of the pixel output circuit 36 and the reset circuit 52. For example, as illustrated in FIG. 7, the pixel output circuit 36 can be constituted by an open-drain buffer circuit including N-type transistors MN11 and MN12. The reset circuit 52 can be constituted by a P-type transistor MP21.

The gate of the N-type transistor MN11 is connected to the output node of the processing circuit 34. The source of the N-type transistor MN11 is connected to a reference voltage node. The drain of the N-type transistor MN11 is connected to the source of the N-type transistor MN12. The drain of the N-type transistor MN12 is connected to the data line 16. The gate of the N-type transistor MN12 is connected to the control line 18. A control signal P_SEL is supplied to the gate of the N-type transistor MN12 from the horizontal scanning circuit unit 60 via the control line 18. The source of the P-type transistor MP21 is connected to a power supply voltage node (voltage Vdd). The drain of the P-type transistor MP21 is connected to the data line 16. The gate of the P-type transistor MP21 is connected to the control line 58. A control signal P_RES is supplied to the gate of the P-type transistor MP21 from the control pulse generation unit 80 via the control line 58. A capacitor Cp connected to the data line 16 represents the wiring parasitic capacitance of the data line 16.

Next, a reading operation of the pixel signal by the pixel output circuit 36 and the reset circuit 52 will be described with reference to FIG. 7.

The control signal P_RES of low level is initially supplied from the control pulse generation unit 80 via the control line 58 to turn the P-type transistor MP21 on. The data line 16 is thereby connected to the power supply voltage node via the P-type transistor MP21, and the wiring parasitic capacitance Cp is charged with the voltage Vdd. In other words, the data line 16 is reset to the voltage Vdd.

Next, the control signal P_SEL of high level is supplied from the horizontal scanning circuit unit 60 via the control line 18 to turn the N-type transistor MN12 on. The drain of the N-type transistor MN11 is thereby connected to the data line 16 via the N-type transistor MN12.

Next, the output signal of the processing circuit 34 (pixel signal held in the processing circuit 34) is supplied to the gate of the N-type transistor MN11. The N-type transistor MN11 is thereby turned on or off depending on the level of the output signal of the processing circuit 34. The N-type transistor MN12 may be turned on after the output signal of the processing circuit 34 is supplied to the gate of the N-type transistor MN11.

If the N-type transistor MN11 is off here, the voltage of the data line 16 is maintained at the voltage Vdd. On the other hand, if the N-type transistor MN11 is on, the charge accumulated in the wiring parasitic capacitance Cp is discharged via the N-type transistors MN12 and MN11, and the voltage of the data line 16 falls to the reference voltage.

Next, after a lapse of a certain time, the determination circuit 54 detects the voltage level of the data line 16. If the voltage of the data line 16 is the voltage Vdd, the determination circuit 54 outputs a low-level signal. If the voltage of the data line 16 is lower than the voltage Vdd, the determination circuit 54 outputs a high-level signal. The reading operation of the pixel signal from the pixel 12 is performed in such a manner.

Now, suitable characteristics of the MOS transistors constituting the pixel output circuit 36 and the reset circuit 52 will be described.

Representative characteristics desired of MOS transistors include low off-leakage current and high driving power. The off-leakage current (also referred to as subthreshold leakage current) is a current that flows between the source and drain of a MOS transistor in a voltage domain (subthreshold domain) where the gate voltage of the MOS transistor is lower than a threshold voltage. Low off-leakage current means low standby current, which can contribute to reduced power consumption. High driving power means high on-resistance and high on-current, which can contribute to high-speed operation.

However, such characteristics trade off each other and are difficult to achieve in a compatible manner. For example, one of the parameters related to the off-leakage current and the driving power is the threshold voltage. Lowering the threshold voltage can increase the driving power, but with an increase in the off-leakage current. Conversely, raising the threshold voltage can reduce the off-leakage current, but with a drop in the driving power. The transistors constituting the circuits of the components of the photoelectric conversion device 100 are therefore desirably designed with a focus on particularly important characteristics desired of the respective circuits.

The pixel output circuit 36 has a function of converging the data line 16 to either the power supply voltage or the reference voltage depending on the output signal of the processing circuit 34. Since the data line 16 is connected to a plurality of pixels 12 corresponding to the number of columns or the number of rows, i.e., a large number of transistors, the parasitic capacitance on the data line 16 is high. In addition, the data line 16 has a large wiring length with high parasitic resistance. The pixel output circuit 36 is thus desirably constituted by transistors with high driving power capable of driving the signal on the high-load wiring. The transistors of the pixel output circuit 36 therefore desirably have a low threshold voltage for improved driving power.

The processing circuit 34 and the pixel output circuit 36 are constituted by fine MOS transistors in view of improved performance and enhanced functionality. Lowering the threshold voltage of the N-type transistors MN11 and MN12 inevitably increases the off-leakage current. However, the current to pass through the N-type transistors MN11 and MN12 flows into the N-type transistors MN11 and MN12 from the power supply voltage node via the P-type transistor MP21 and the data line 16. In other words, the N-type transistors MN11 and MN12 and the P-type transistor MP21 each constitute a part of the electrical path from the power supply voltage node to the reference voltage node via the data line 16. The off-leakage current flowing through the N-type transistors MN11 and MN12 thus is the same as that of the transistor where the off-leakage current is the lowest among the N-type transistors MN11 and MN12 and the P-type transistor MP21. If the P-type transistor MP21 is constituted by a transistor of low off-leakage current, the off-leakage current to flow therefore can consequently be reduced even in a case where the N-type transistors MN11 and MN12 are constituted by transistors of high off-leakage current.

From such a viewpoint, the transistor constituting the reset circuit 52 (P-type transistor MP21) desirably has an off-leakage current lower than that of the transistors constituting the pixel output circuit 36 (N-type transistors MN11 and MN12). In other words, the threshold voltage of the transistor constituting the reset circuit 52 (P-type transistor MP21) desirably has an absolute value greater than that of the threshold voltage of the transistors constituting the pixel output circuit 36 (N-type transistors MN11 and MN12).

The reset circuit 52 has a function of resetting the potential of the data line 16 to the power supply voltage. Like the transistors constituting the pixel output circuit 36, the transistor constituting the reset circuit 52 thus desirably has high driving power capable of driving the high-load wiring. If even higher driving power is desired of the reset circuit 52, the element size (gate width) of the transistor constituting the reset circuit 52 can be increased for higher driving power. Since the degree of integration of the reset circuit 52 is lower than that of the pixel unit 10, increasing the size of the transistor constituting the reset circuit 52 for high driving power does not much affect the circuit scale. Such a configuration can thus improve the driving power while reducing the off-leakage current of the transistor constituting the reset circuit 52.

There is no particular limitation on how to make the threshold voltage of the transistor of the reset circuit 52 higher than that of the transistors of the pixel output circuit 36. For example, any of the following methods or a combination of these can be used for that purpose.

Figure 8A:
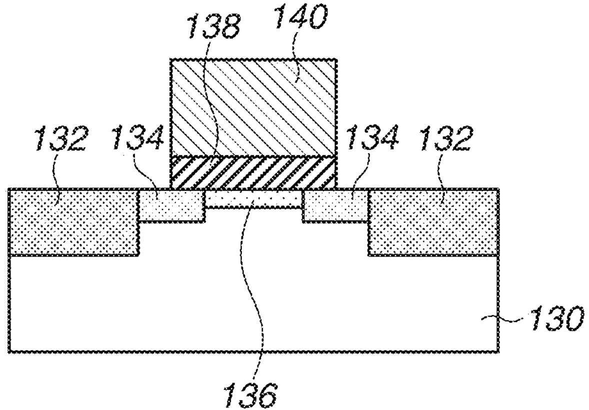
FIGS. 8A to 8F are diagrams for describing how to control a threshold voltage of a metal-oxide-semiconductor (MOS) transistor.

FIG. 8A is a schematic diagram illustrating a configuration example of a transistor constituting the pixel output circuit 36. FIGS. 8B to 8F are schematic diagrams illustrating configuration examples of the transistor constituting the reset circuit 52. Each of the transistors illustrated in FIGS. 8A to 8F includes source/drain regions 132, extension regions 134 (low doped drain [LDD] regions), and a channel doped layer 136 that are disposed in a surface portion of a well 130. Each transistor also includes a gate insulation film 138 disposed on the well 130, and a gate electrode 140 disposed on the gate insulation film 138. The well 130 has a conductivity type opposite to that of the transistor. In other words, an N-type transistor is formed on a P-type well 130. A P-type transistor is formed on an N-type well 130. The channel doped layer 136 is a region doped with impurities of the same conductivity type as that of the transistor. More specifically, the channel doped layer 136 is a region doped with N-type impurities if the transistor is an N-type transistor, and a region doped with P-type impurities if the transistor is a P-type transistor. Alternatively, the channel doped layer 136 may be doped with impurities of the opposite conductivity type to that of the transistor. More specifically, the channel doped layer 136 may be a region doped with P-type impurities if the transistor is an N-type transistor, and a region doped with N-type impurities if the transistor is a P-type transistor. The higher the impurity concentration of the same conductivity type as that of the transistor, the lower the threshold. The lower the impurity concentration of the opposite conductivity type to that of the transistor, the lower the threshold voltage. In FIGS. 8B to 8F, each transistor includes the extension regions 134 and the channel doped layer 136, whereas such components are optional. For example, if a transistor does not have the extension regions 134 or the channel doped layer 136, the threshold voltage may be changed by changing the thickness of the gate insulation film 138.

Figure 8B:
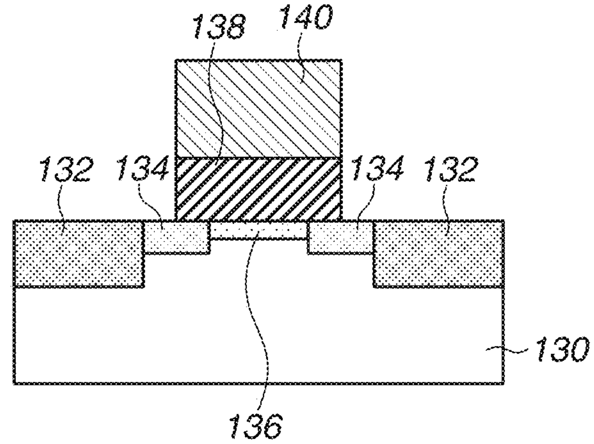
Figure 8C:
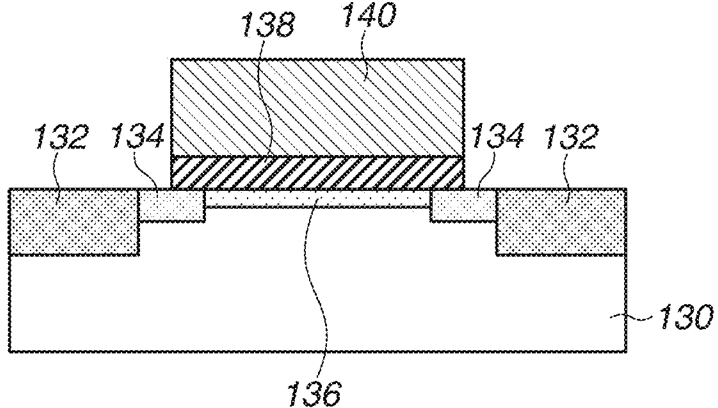
Figure 8D:
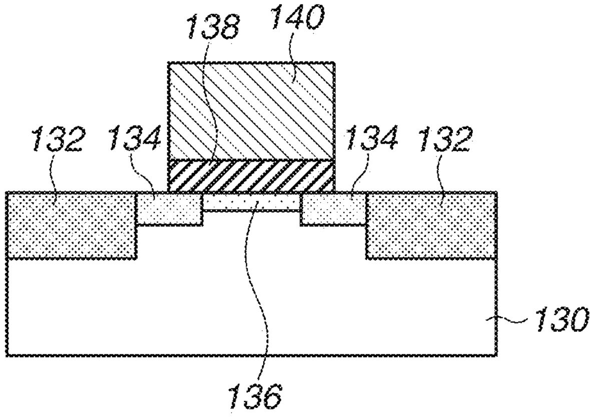
Figure 8E:
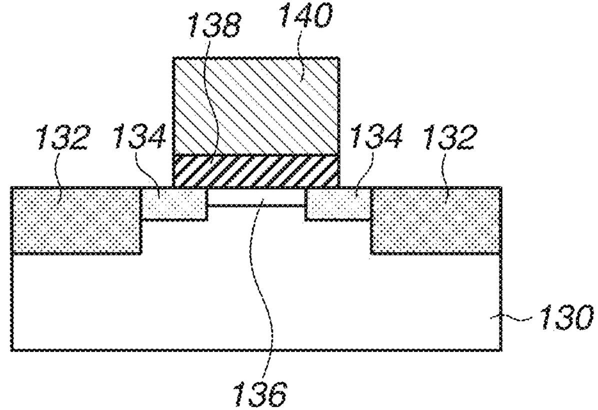
Figure 8F:
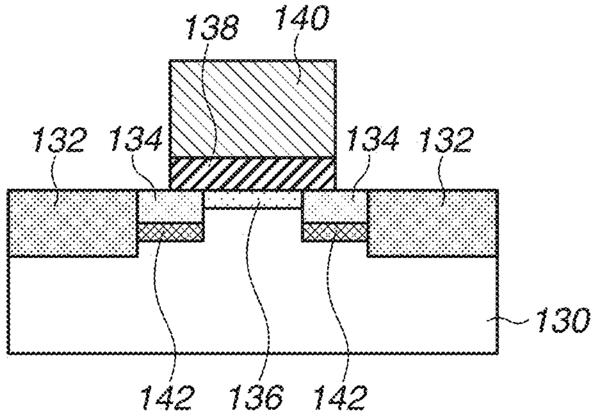

In the transistor illustrated in FIG. 8B, the gate insulation film 138 is thickener than that of the transistor of FIG. 8A. The transistor of FIG. 8B is otherwise the same as the transistor of FIG. 8A. The transistor illustrated in FIG. 8C has a gate length greater than that of the transistor of FIG. 8A. The transistor of FIG. 8C is otherwise the same as the transistor of FIG. 8A. In the transistor illustrated in FIG. 8D, the extension regions 134 have a lower impurity concentration than with the transistor of FIG. 8A. The transistor of FIG. 8D is otherwise the same as the transistor of FIG. 8A. In the transistor illustrated in FIG. 8E, the impurity concentration of the impurities of the same conductivity type as that of the transistor in the channel region (the impurity concentration of the channel doped layer 136) is lower than with the transistor of FIG. 8A. Alternatively, the impurity concentration of the impurities of the opposite conductivity type to that of the transistor in the channel region is higher than with the transistor of FIG. 8A. The transistor of FIG. 8E is otherwise the same as the transistor of FIG. 8A. The transistor illustrated in FIG. 8F includes halo injection layers 142 of the opposite conductivity type to that of the source/drain regions 132 and the extension regions 134. The halo injection layers 142 are located deeper than the extension regions 134 of the transistor of FIG. 8A. The transistor of FIG. 8F is otherwise the same as the transistor of FIG. 8A. In any of the structures illustrated in FIGS. 8B to 8F, the transistor has a threshold voltage higher than that of the transistor of FIG. 8A.

The transistors constituting the other functional blocks of the pixel unit 10 and the reading circuit unit 50 are also desirably designed as appropriate based on their desirable characteristics.

The processing circuit 34 desirably has a high degree of integration in view of reduced pixel size and enhanced functionality, but does not need high driving power. The processing circuit 34 is therefore desirably constituted by transistors with low off-leakage current in view of reduced power consumption. In terms of comparison with the pixel output circuit 36, the transistors constituting the processing circuit 34 desirably have a low off-leakage current compared to the transistors constituting the pixel output circuit 36. In other words, the threshold voltage of the transistors constituting the processing circuit 34 desirably has an absolute value greater than that of the threshold voltage of the transistors constituting the pixel output circuit 36.

The determination circuit 54 is a circuit for determining the potential level of the data line 16, and does not need driving power such as desired of the pixel output circuit 36 or the reset circuit 52. The determination circuit 54 is therefore desirably constituted by transistors having low off-leakage current in view of reduced power consumption. In terms of comparison with the pixel output circuit 36, the transistors constituting the determination circuit 54 desirably have a low off-leakage current compared to the transistors constituting the pixel output circuit 36. In other words, the threshold voltage of the transistors constituting the determination circuit 54 desirably has an absolute value greater than that of the threshold voltage of the transistors constituting the pixel output circuit 36. Since the degree of integration of the determination circuit 54 is lower than that of the pixel unit 10, the transistors constituting the determination circuit 54 can be increased in element size.

The waveform shaping circuit 32 is constituted by transistors having higher withstand voltage than that of the transistors constituting the processing circuit 34, the pixel output circuit 36, and the reading circuit unit 50 since a voltage higher than the voltage Vdd is applied to the waveform shaping circuit 32. The high withstand voltage transistors can be transistors with a gate insulation film thicker than those of the transistors constituting the processing circuit 34 and the pixel output circuit 36. If the quenching element 24 is constituted by a transistor, the transistor constituting the quenching element 24 has higher withstand voltage than that of the transistors constituting the processing circuit 34, the pixel output circuit 36, and the reading circuit unit 50, like the waveform shaping circuit 32.

If the voltage design of the quenching element 24 is made without a voltage margin, the waveform shaping circuit 32 and the quenching element 24 are desirably constituted by transistors with off-leakage current lower than that of the transistors constituting the processing circuit 34. If the processing circuit 34 is designed to maximize its degree of integration, the processing circuit 34 is desirably constituted by transistors with off-leakage current lower than that of the transistors constituting the waveform shaping circuit 32 and the quenching element 24.

The vertical scanning circuit unit 40, the horizontal scanning circuit unit 60, the output circuit unit 70, and the control pulse generation unit 80 are desirably constituted by transistors with low off-leakage current in view of reduced power consumption. In terms of comparison with the pixel output circuit 36, the transistors constituting the vertical scanning circuit unit 40, the horizontal scanning circuit unit 60, the output circuit unit 70, and the control pulse generation unit 80 desirably have a low off-leakage current compared to the transistors constituting the pixel output circuit 36.

According to the present exemplary embodiment, the photoelectric conversion device 100 can thus be enhanced in functionality and reduced in power consumption.

Second Embodiment

A photoelectric conversion device according to a second exemplary embodiment of the present invention will be described with reference to FIG. 9. Components similar to those of the photoelectric conversion device according to the first exemplary embodiment are denoted by the same reference numerals. A description thereof will be omitted or simplified.

The pixel output circuit 36 and the reset circuit 52 are not limited to the configuration described in the first exemplary embodiment. The present exemplary embodiment describes a photoelectric conversion device where the pixel output circuit 36 is constituted by an open-drain buffer circuit that outputs differential signals.

Figure 9:
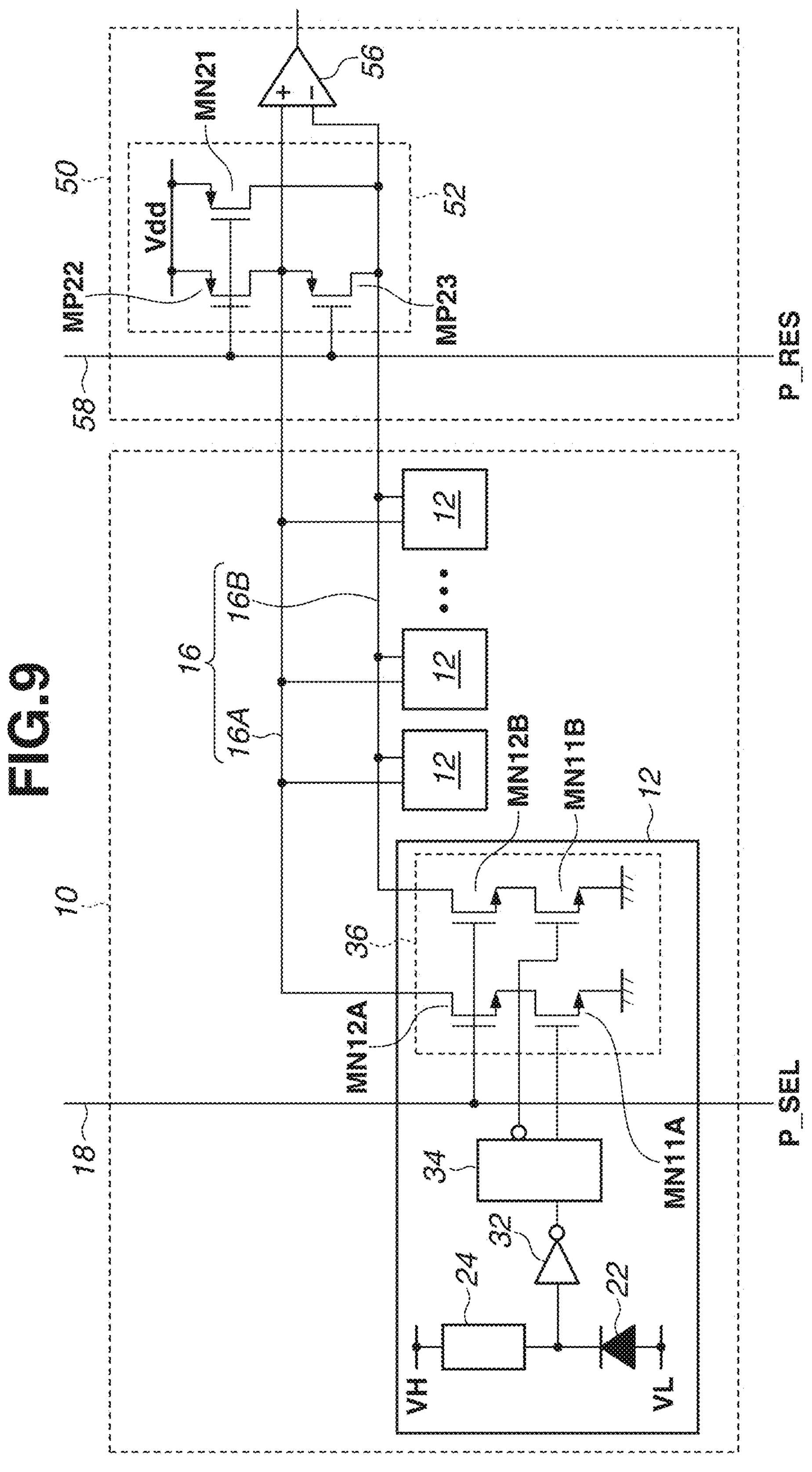
FIG. 9 is a circuit diagram illustrating a configuration example of a pixel output circuit and a reset circuit in a photoelectric conversion device according to a second exemplary embodiment of the present invention.

FIG. 9 is a circuit diagram illustrating a configuration example of a pixel output circuit 36 and a reset circuit 52 in the photoelectric conversion device according to the present exemplary embodiment. In the present exemplary embodiment, a processing circuit 34 includes a non-inverting signal output node for outputting a non-inverted signal and an inverting signal output node for outputting an inverted signal. The pixel output circuit 36 is constituted by an open-drain buffer circuit including N-type transistors MN11A, MN12A, MN11B, and MN12B. The reset circuit 52 is constituted by P-type transistors MP21, MP22, and MP23. A data line 16 includes a pair of data lines 16A and 16B. A determination circuit 54 according to the first exemplary embodiment is replaced by a differential amplifier circuit 56 in the second exemplary embodiment.

The gate of the N-type transistor MN11A is connected to the non-inverting signal output node of the processing circuit 34. The source of the N-type transistor MN11A is connected to a reference voltage node. The drain of the N-type transistor MN11A is connected to the source of the N-type transistor MN12A. The drain of the N-type transistor MN12A is connected to the data line 16A. The gate of the N-type transistor MN12A is connected to a control line 18. A control signal P_SEL is supplied to the gate of the N-type transistor MN12A from a horizontal scanning circuit unit 60 via the control line 18.

Similarly, the gate of the N-type transistor MN11B is connected to the inverting signal output node of the processing circuit 34. The source of the N-type transistor MN11B is connected to the reference voltage node. The drain of the N-type transistor MN11B is connected to the source of the N-type transistor MN12B. The drain of the N-type transistor MN12B is connected to the data line 16B. The gate of the N-type transistor MN12B is connected to the control line 18. The control signal P_SEL is supplied to the gate of the N-type transistor MN12B from the horizontal scanning circuit unit 60 via the control line 18.

The source of the P-type transistor MP21 and the source of the P-type transistor MP22 are connected to a power supply voltage node (voltage Vdd). The drain of the P-type transistor MP21 is connected to the data line 16B. The drain of the P-type transistor MP22 is connected to the data line 16A. The source of the P-type transistor MP23 is connected to the data line 16A. The drain of the P-type transistor MP23 is connected to the data line 16B. The gates of the P-type transistors MP21, MP22, and MP23 are connected to a control line 58. A control signal P_RES is supplied to the gates of the P-type transistors MP21, MP22, and MP23 from a control pulse generation unit 80 via the control line 58. The reset circuit 52 can include at least two of the P-type transistors MP21, MP22, and MP23.

The data line 16A is connected to an inverting input node of the differential amplifier circuit 56. The data line 16B is connected to a non-inverting input node of the differential amplifier circuit 56.

Next, a reading operation of a pixel signal by the pixel output circuit 36 and the reset circuit 52 will be described with reference to FIG. 9.

First, the control pulse generation unit 80 supplies the control signal P_RES of low level via the control line 58 to turn the P-type transistors MP21, MP22, and MP23 on. The data lines 16A and 16B are thereby connected to the power supply voltage node via the P-type transistors MP21, MP22, and MP23, and the wiring parasitic capacitances of the data lines 16A and 16B are charged with the voltage Vdd. In other words, the data lines 16A and 16B are reset to the voltage Vdd.

Next, the horizontal scanning circuit unit 60 supplies the control signal P_SEL of high level via the control line 18 to turn the N-type transistors MN12A and MN12B on. The drain of the N-type transistor MN11A is thereby connected to the data line 16A via the N-type transistor MN12A, and the drain of the N-type transistor MN11B to the data line 16B via the N-type transistor MN12B.

Next, the output signals of the processing circuit 34 are supplied to the gates of the N-type transistors MN11A and MN11B. The N-type transistors MN11A and MN11B are thereby turned on or off depending on the levels of the output signals of the processing circuit 34. The N-type transistors MN12A and MN12B may be turned on after the output signals of the processing circuit 34 are supplied to the gates of the N-type transistors MN11A and MN11B.

Here, if the N-type transistor MN11A is off and the N-type transistor MN11B is on, the voltage of the data line 16A is maintained at the voltage Vdd, and the voltage of the data line 16B falls to the reference voltage. On the other hand, if the N-type transistor MN11A is on and the N-type transistor MN11B is off, the voltage of the data line 16A falls to the reference voltage and the voltage of the data line 16B is maintained at the voltage Vdd.

Next, after a lapse of a certain time, the differential amplifier circuit 56 detects the voltage levels of the data lines 16A and 16B. If the voltage of the data line 16B is higher than that of the data line 16A, the differential amplifier circuit 56 outputs a high-level signal. If the voltage of the data line 16A is higher than that of the data line 16B, the differential amplifier circuit 56 outputs a low-level signal.

Suitable characteristics of the MOS transistors constituting the pixel output circuit 36 and the reset circuit 52 are similar to those in the first exemplary embodiment. Specifically, the transistors constituting the reset circuit 52 desirably have off-leakage current lower than that of the transistors constituting the pixel output circuit 36. On comparison of the threshold voltages of the transistors, the threshold voltages of the transistors constituting the reset circuit 52 desirably have an absolute value greater than that of the threshold voltages of the transistors constituting the pixel output circuit 36. The transistors constituting the reset circuit 52 here include the P-type transistors MP21, MP22, and MP23. The transistors constituting the pixel output circuit 36 include the N-type transistors MN11A, MN12A, MN11B, and MN12B.

The transistors constituting the other functional blocks of the photoelectric conversion device 100 are similar to those of the first exemplary embodiment. For example, the transistors constituting the processing circuit 34 and the differential amplifier circuit 56 desirably have off-leakage current lower than that of the transistors constituting pixel output circuit 36. On comparison of the threshold voltages of the transistors, the threshold voltages of the transistors constituting the processing circuit 34 and the differential amplifier circuit 56 desirably have an absolute value greater than that of the threshold voltages of the transistors constituting the pixel output circuit 36. Since the degree of integration of the differential amplifier circuit 56 is lower than that of the pixel unit 10, the transistors constituting the differential amplifier circuit 56 can be increased in element size. The transistors constituting the quenching element 24 and the waveform shaping circuit 32 are desirably constituted by transistors having higher withstand voltage than that of the transistors constituting the processing circuit 34, the pixel output circuit 36, and the reading circuit unit 50.

According to the present exemplary embodiment, the photoelectric conversion device can thus be enhanced in functionality and reduced in power consumption.

Modification

Figure 10:
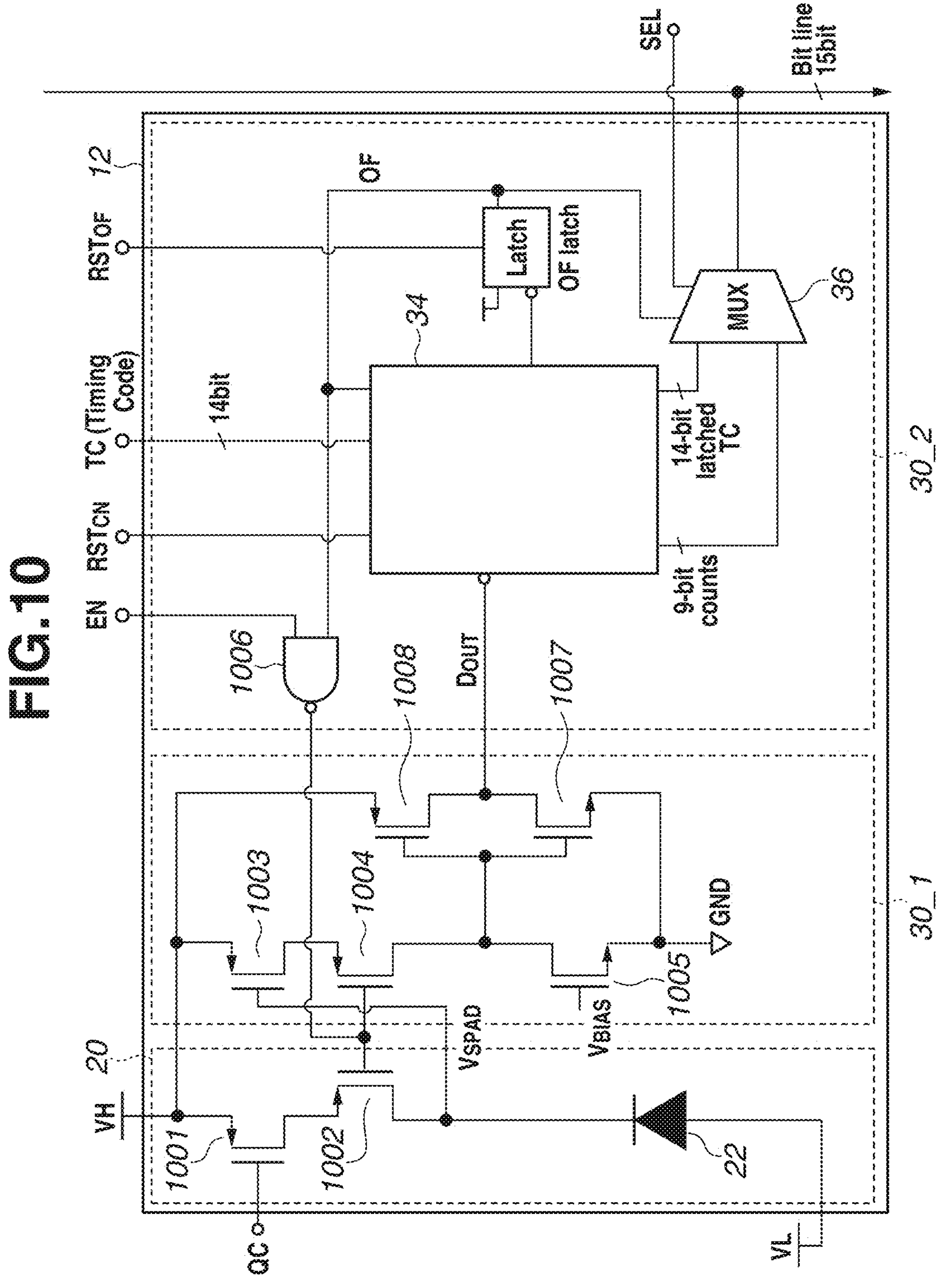
FIG. 10 is a diagram for describing a modification of a pixel according to the first or second exemplary embodiment of the present invention.

A modification of the first or second exemplary embodiment of the present invention will be described with reference to FIG. 10. FIG. 10 is a block diagram illustrating a configuration example of a pixel in a photoelectric conversion device according to the present modification. In FIG. 10, components denoted by the same reference numerals as in FIG. 3 are ones serving functions similar to those in FIG. 3. Note that while the reference numeral 34 in FIG. 3 denotes a "processing circuit", the reference numeral 34 in FIG. 10 denotes a "counter", which is a type of "processing circuit".

The present modification describes a photoelectric conversion device that implements high dynamic range (HDR) processing for extending a dynamic range. Photoelectric conversion devices including counters for counting the output signals of APDs perform a lot of counting in a high illuminance environment, which is accompanied by increased power consumption. In the present modification, counting is normally performed in a low illuminance environment. In a high illuminance environment, the APDs are stopped when predetermined counts are reached (in the event of overflow). The counts are then calculated by extrapolation based on code corresponding to the timing of overflow (overflow timing code). Such signals are then combined to obtain an image. According to such a configuration, the counters can be reduced in scale. This enables space saving of the pixel circuits, and an HDR photoelectric conversion device capable of reducing power consumption can be provided.

In FIG. 10, a pixel 12 of the photoelectric conversion device includes a photoelectric conversion unit 20 and a pixel signal processing unit 30. The photoelectric conversion device 20 includes a photon detection element 22, a transistor 1001 corresponding to a quenching element 24, and a transistor 1002. The transistor 1002 functions as a switch for switching whether to supply the photon detection element 22 with a reverse bias voltage for avalanche multiplication. The pixel signal processing unit 30 includes a buffer unit 30_1 and a counter and control logic unit 30_2. The buffer unit 30_1 includes an inverter circuit constituted by transistors 1007 and 1008.

(Details of Counting Operation)

The counter and control logic unit 30_2 includes a logic circuit 1006. The logic circuit 1006 outputs a signal based on an enable (EN) signal and an overflow (OF) signal. Specifically, if the EN signal is at a high (H) level and the OF signal is at a H level, the output signal of the logic circuit 1006 is at a low (L) level. Since the output signal from the logic circuit 1006 is at the L level, the transistor 1002 and a transistor 1004 turn on. A gate input QC of the transistor 1001 is set to a L level to turn the transistor 1001 on. As a result, the voltage of a node $V_{SPAD}$ is recharged with a voltage VH, and the photon detection element 22 enters a standby state. If a photon is incident on the photon detection element 22 and an avalanche current occurs, the voltage of the node $V_{SPAD}$ drops and a transistor 1003 turns on. The input voltage of the inverter circuit is thus set to a H level via the transistor 1003 turned on and the transistor 1004 remaining on. Since the gate input QC is fixed at the L level, the voltage of the node $V_{SPAD}$ is immediately recharged (passive recharge). With the voltage of the node $V_{SPAD}$ recharged, the transistor 1003 turns off and the input voltage of the inverter circuit is set to a ground (GND) level by the transistor 1005. In other words, the input voltage of the inverter circuit is lowered from the H level to the L level. Since the input of the inverter circuit is thus set to the H level by the incidence of the photon and then lowered to the L level, a pulse signal is output from an output Dour of the inverter circuit, and the counter 34 increases its count by one. The counter 34 counts up through repetition of such operation.

(Differences in Operation Between Different Environments)

In a low illuminance environment, the counter 34 can finish counting without saturation within an exposure period. For example, if the counter 34 is a 9-bit counter, the count is less than 512. In such a case, the count of the counter 34 is output to a bit line (for example, 15 bits) via the pixel output circuit 36 (multiplexer MUX) at timing when a SEL signal is input after the end of the exposure period. The signal output to the bit line is transferred to a sense amplifier.

By contrast, in a high illuminance environment, the counter 34 saturates within an exposure period. For example, when the most significant bit of the counter 34 carries over, an OF flag is latched into an OF latch. In such a case, the OF signal that is the output of the OF latch changes from the H level to the L level. Since the EN signal that is one of the input signals of the logic circuit 1006 is at the H level and the OF signal changes to the low level, the output of the logic circuit 1006 transitions from the L level to the H level. This switches the transistors 1002 and 1004 from on to off. Since the transistor 1002 turns off, the voltage of the node $V_{SPAD}$ is not recharged and an avalanche multiplication operation no longer occurs. Since the transistor 1004 turns off, the input of the inverter circuit is fixed to the L level irrespective of the voltage of the node $V_{SPAD}$. The exposure period is terminated in such a manner.

Meanwhile, timing code TC is input to the counter 34 from outside. The timing code TC is latched (recorded) at timing when the most significant bit of the counter 34 carries over. The latched timing code TC (for example, 14 bits) output from the counter 34 and the OF flag are output to the bit line via the pixel output circuit 36 (multiplexer MUX). The timing code TC serves as time information about time from the start of exposure to the saturation of the counter 34.

Before the next exposure period starts, the counter 34 is reset by a reset signal $RST_{CN}$, and the OF latch is reset by a reset signal $RST_{OF}$.

In the foregoing description, the counter 34 is assumed to count up to the most significant bit. However, the counter 34 does not necessarily need to be used up to the most significant bit, and may be configured to latch the timing code TC when the count of the counter 34 reaches a predetermined value. In other words, the timing code TC may be time information about time from the start of exposure to when the counter 34 reaches the predetermined value. The pixel output circuit 36 controls the output of the time information about time until the predetermined value is reached.

(Types of Transistors)

The transistors 1001 and 1002 are disposed between the voltages VH and VL. The transistors 1001 and 1002 are electrically connected to a high potential difference, which is the difference between the voltages VH and VL. The transistors 1001 and 1002 are therefore constituted by high withstand voltage transistors.

The signal output from the node $V_{SPAD}$ of the photoelectric conversion unit 20 (hereinafter, referred to as a signal $V_{SPAD}$) has a predetermined amplitude (voltage V1) corresponding to the operation of the photoelectric conversion unit 20. This voltage V1 is usually higher than the amplitude (voltage V2) of internal signals of logic circuits. To ensure the withstand voltage, the transistor 1003 is constituted by a high withstand voltage transistor.

The amplitude (voltage V2) of the signal input to the gate of the transistor 1004, i.e., the output signal from the logic circuit 1006 is smaller than the predetermined amplitude (voltage V1) corresponding to the operation of the photoelectric conversion unit 20. The transistor 1004 can therefore be a low withstand voltage transistor capable of high-speed operation with low power consumption. In other words, the signal processing circuit (buffer section 30_1) includes a first element having a first withstand voltage (transistor 1003) and a second element having a second withstand voltage lower than the first withstand voltage (transistor 1004). The signal processing circuit (buffer section 30_1) is configured so that a first signal (signal $V_{SPAD}$) is input to the first element and a second signal (signal from the logic circuit 1006) is input to the second element. The signal processing circuit (buffer section 30_1) controls the output of a third signal (output signal from the inverter circuit) based on the first signal (signal $V_{SPAD}$) and the second signal (signal from the logic circuit 1006).

In addition, the transistors constituting the buffer section 30_1 other than the transistor 1003 can be configured as low withstand voltage transistors. Specifically, the transistors 1005, 1007, and 1008 are configured as low withstand voltage transistors.

The low withstand voltage transistors and the high withstand voltage transistors can be implemented by making the thicknesses of the gate insulation films of both types of transistors different from each other. Specifically, the thickness of the gate insulation films of the high withstand voltage transistors is made greater than that of the gate insulation films of the low withstand voltage transistors.

(Driving Timing Chart)

Figure 11A:
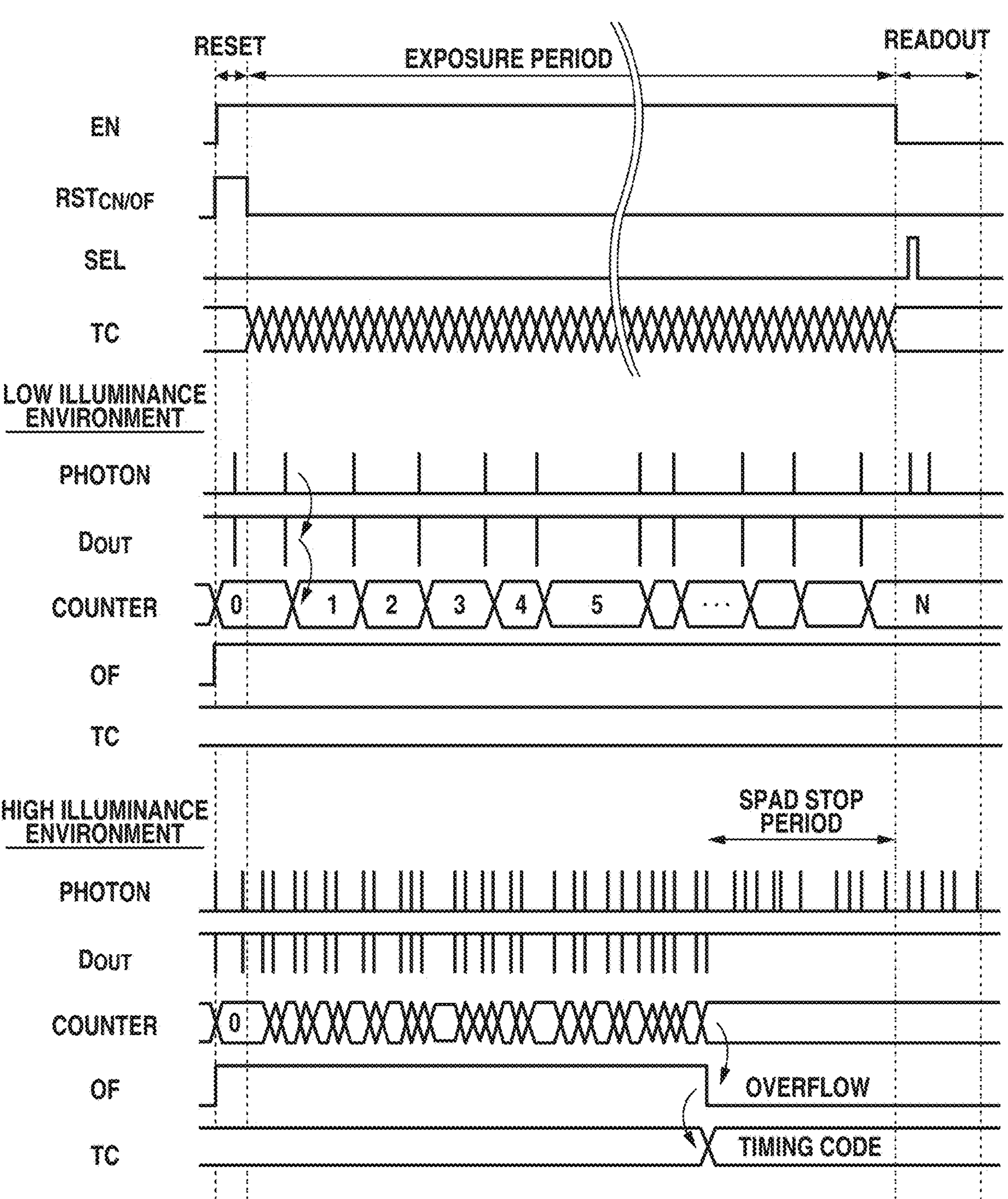
FIG. 11A is a timing chart for describing an operation of the modification of the pixel according to the first or second exemplary embodiment of the present invention.

The upper part of FIG. 11A is a timing chart. The reset signals $RST_{CN}$ and $RST_{OF}$ transition from the L level to the H level at timing when the EN signal transitions from the L level to the H level, and then transition from the H level to the L level. The counter 34 and the OF latch are thereby reset. The OF signal also transitions from the L level to the H level at the timing when the EN signal transitions from the L level to the H level. When the resetting is completed, the exposure period starts and the counting of the timing code TC starts.

The middle part of FIG. 11A is a diagram illustrating an operation in a low illuminance environment. When a photon is incident, a pulse signal is output from the output Dour and the counter 34 counts up. Since the most significant bit of the counter 34 does not carry over, the OF flag is maintained at the H level.

The lower part of FIG. 11A is a diagram illustrating an operation in a high illuminance environment. Since the most significant bit of the counter 34 carries over to overflow, the OF flag transitions from the H level to the L level. The timing code TC is thereby latched.

Figure 11B:
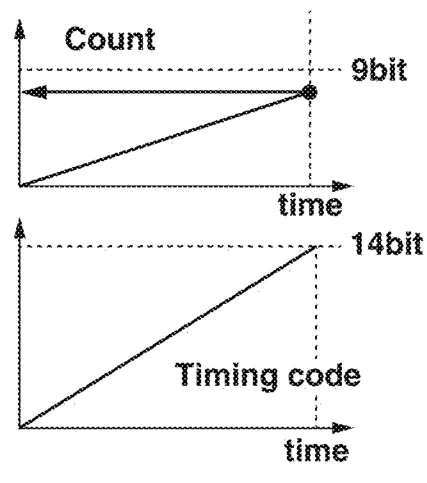
FIG. 11B is a relationship diagram of time and a count in the modification of the pixel according to the first or second exemplary embodiment of the present invention.
Figure 11B:
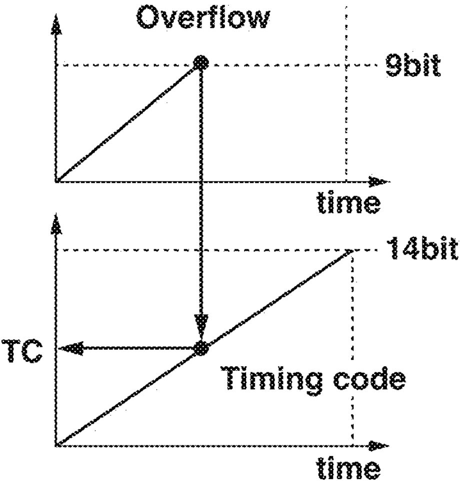

In the low illuminance environment of FIG. 11B, the counter 34 does not overflow, and the count itself is simply used as the count. By contrast, in the high illuminance environment, the counter 34 overflows and the value of the timing code TC at the time of the overflow is latched.

Figure 11C:
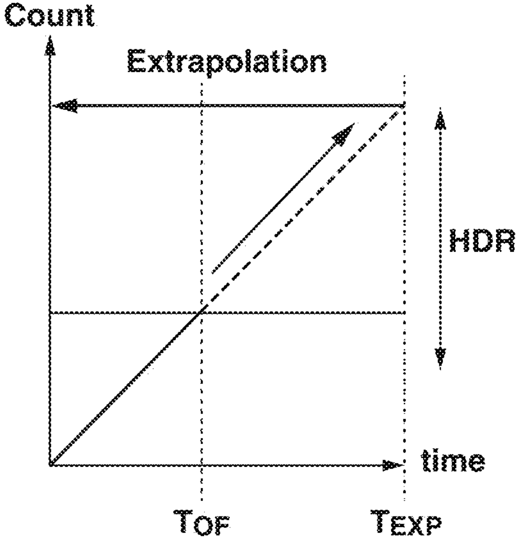
FIG. 11C is a relationship diagram of time and timing code in the modification of the pixel according to the first or second exemplary embodiment of the present invention.

FIG. 11C is a diagram illustrating the signal processing in the case where the counter 34 overflows. Since the counter 34 overflows at time Tor, a predicted count is calculated from the value of the timing code TC, and the calculated predicted count is used as the numerical value for image formation. More specifically, the predicted count is extrapolated from the value of the timing code TC. Instead of calculating the predicted count from the value of the timing code TC each time, a table defining the correspondence between the value of the timing code TC and the predicted count may be prepared in advance, and the predicted count may be acquired based on the value of the timing code TC without calculation.

An acquisition unit that acquires the predicted count based on the value of the timing code TC (time information about when the count reaches a predetermined value) may be included in the photoelectric conversion device 100. Alternatively, the acquisition unit may be implemented outside the photoelectric conversion device 100 as an acquisition apparatus for acquiring the predicted count.

Third Embodiment

Figure 12:
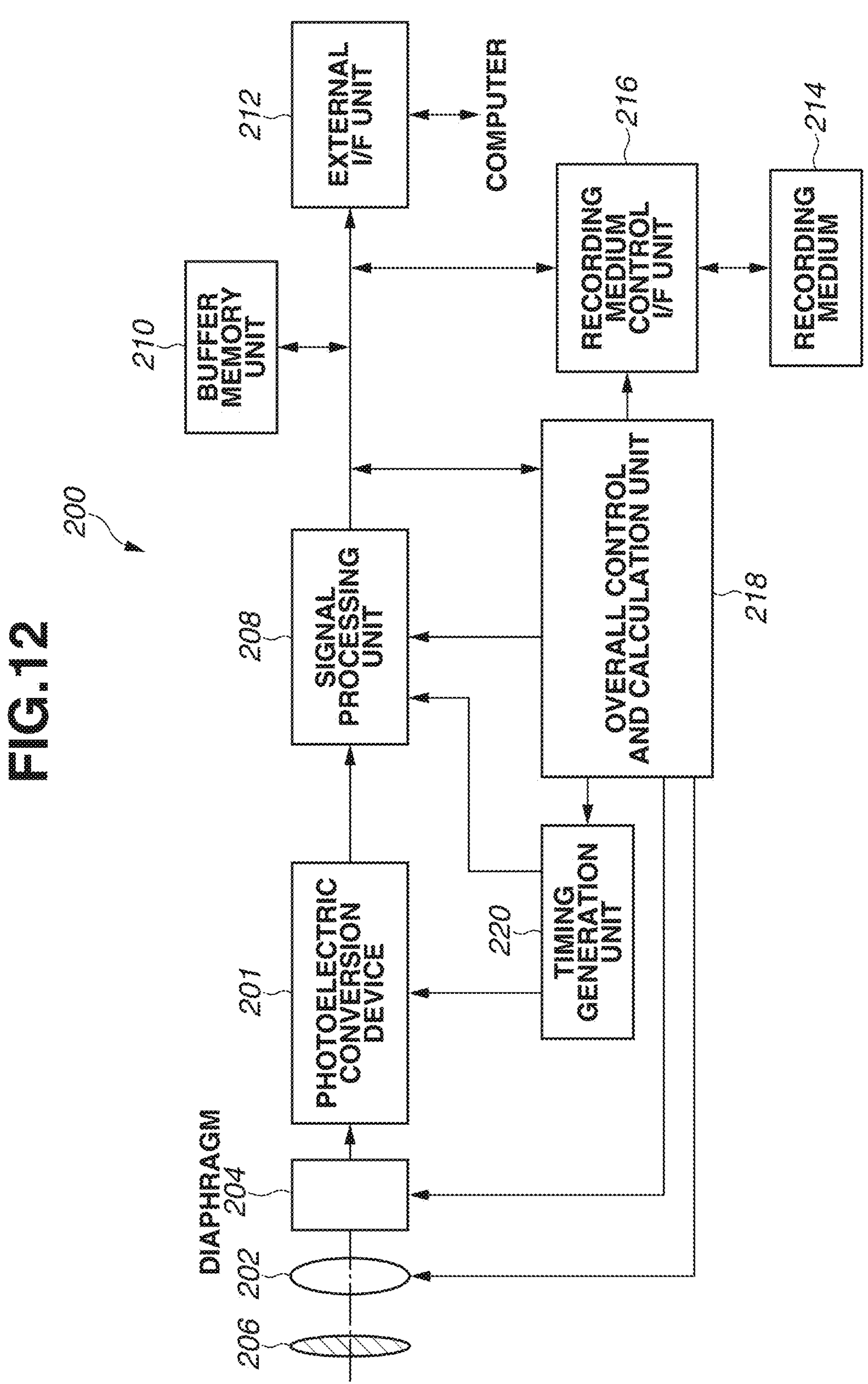
FIG. 12 is a block diagram illustrating a schematic configuration of an optical detection system according to a fourth exemplary embodiment of the present invention.

An optical detection system according to a third exemplary embodiment of the present invention will be described with reference to FIG. 12. FIG. 12 is a block diagram illustrating a schematic configuration of the optical detection system according to the present exemplary embodiment. In the present exemplary embodiment, an optical detection sensor to which the photoelectric conversion device 100 according to either of the first and second exemplary embodiments is applied will be described.

The photoelectric conversion devices 100 described in the foregoing first and second exemplary embodiments can be applied to various optical detection systems. Examples of the applicable optical detection systems include imaging systems such as a digital still camera, a digital camcorder, a surveillance camera, a copying machine, a facsimile, a mobile phone, an on-vehicle camera, and an observation satellite. A camera module including an optical system, such as a lens, and an imaging device is also included in the optical detection systems. FIG. 12 illustrates a block diagram of a digital still camera as an example of these.

An optical detection system 200 illustrated in FIG. 12 includes a photoelectric conversion device 201, a lens 202 for forming an optical image of an object on the photoelectric conversion device 201, a diaphragm 204 for adjusting the amount of light passing through the lens 202, and a barrier 206 for protecting the lens 202. The lens 202 and the diaphragm 204 are an optical system for collecting light to the photoelectric conversion device 201. The photoelectric conversion device 201 is the photoelectric conversion device 100 described in either of the first and second exemplary embodiments, and converts the optical image formed by the lens 202 into image data.

The optical detection system 200 also includes a signal processing unit 208 that processes an output signal (digital signal) output from the photoelectric conversion device 201. The signal processing unit 208 generates image data from the digital signal output from the photoelectric conversion device 201. The signal processing unit 208 performs various types of correction and compression as appropriate and outputs the image data. The photoelectric conversion device 201 can include an analog-to-digital (AD) conversion unit that generates the digital signal to be processed by the signal processing unit 208. The AD conversion unit may be formed on the semiconductor layer (semiconductor substrate) where the photon detection elements of the photoelectric conversion device 201 are formed, or on a semiconductor substrate different from the semiconductor layer where the photon detection elements of the photoelectric conversion device 201 are formed. The signal processing unit 208 may be formed on the same semiconductor substrate as that of the photoelectric conversion device 201.

The optical detection system 200 further includes a buffer memory unit 210 for temporarily storing the image data, and an external interface (I/F) unit 212 for communicating with an external computer. The optical detection system 200 further includes a recording medium 214 for recording or reading captured data, such as a semiconductor memory, and a recording medium control I/F unit 216 for recording or reading the captured data on/from the recording medium 214. The recording medium 214 may be built in the optical detection system 200 or detachably attachable to the optical detection system 200. The communication between the recording medium control I/F unit 216 and the recording medium 214 and the communication from the external I/F unit 212 may be wirelessly performed.

The optical detection system 200 further includes an overall control and calculation unit 218 that controls various calculations and the entire digital still camera, and a timing generation unit 220 that outputs various timing signals to the photoelectric conversion device 201 and the signal processing unit 208. The timing signals may be input from outside. The optical detection system 200 can include at least the photoelectric conversion device 201 and the signal processing unit 208 for processing the output signal output from the photoelectric conversion device 201. The timing generation unit 220 may be incorporated into the photoelectric conversion device 201. The overall control and calculation unit 218 and the timing generation unit 220 may be configured to implement some or all of the control functions of the photoelectric conversion device 201.

The photoelectric conversion device 201 outputs an imaging signal to the signal processing unit 208. The signal processing unit 208 performs predetermined signal processing on the imaging signal output from the photoelectric conversion device 201 and outputs image data. The signal processing unit 208 generates an image using the imaging signal. The signal processing unit 208 may be configured to perform distance measurement calculation on the signal output from the photoelectric conversion device 201.

As described above, according to the present exemplary embodiment, an optical detection system capable of acquiring images of higher quality can be implemented by configuring the optical detection system using the photoelectric conversion device 100 according to either of the first and second exemplary embodiments.

Fourth Embodiment

Figure 13:
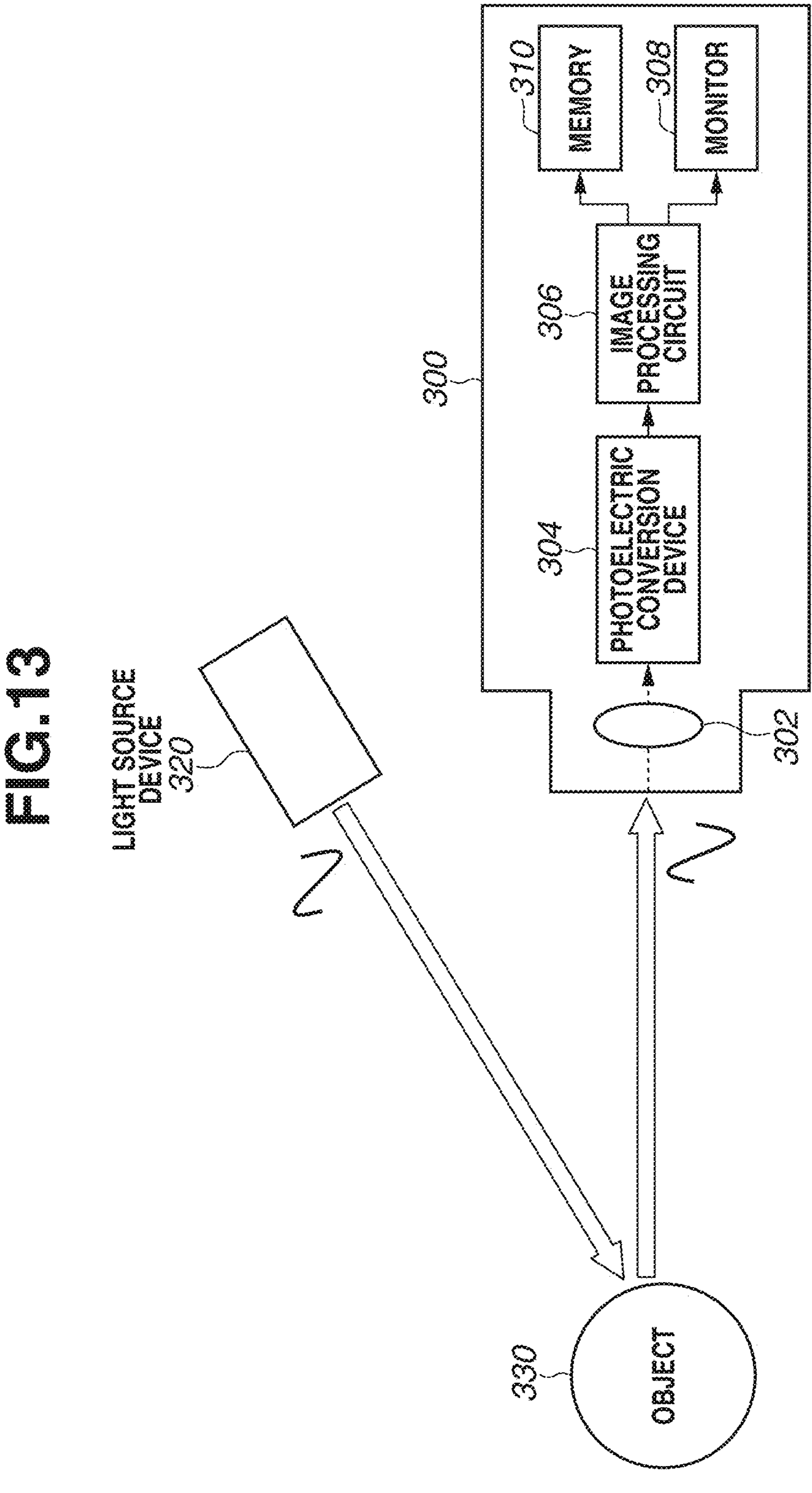
FIG. 13 is a block diagram illustrating a schematic configuration of a distance image sensor according to a fifth exemplary embodiment of the present invention.

A distance image sensor according to a fourth exemplary embodiment of the present invention will be described with reference to FIG. 13. FIG. 13 is a block diagram illustrating a schematic configuration of the distance image sensor according to the present exemplary embodiment. In the present exemplary embodiment, the distance image sensor will be described as an example of an optical detection system to which the photoelectric conversion device 100 according to either of the first and second exemplary embodiments is applied.

As illustrated in FIG. 13, a distance image sensor 300 according to the present exemplary embodiment can include an optical system 302, a photoelectric conversion device 304, an image processing circuit 306, a monitor 308, and a memory 310. This distance image sensor 300 receives light (modulated light or pulsed light) emitted from a light source device 320 toward an object 330 and reflected at the surface of the object 330, and obtains a distance image based on the distance to the object 330.

The optical system 302 includes one or more lenses, and has a function of focusing image light (incident light) from the object 330 on the light reception surface (sensor unit) of the photoelectric conversion device 304.

The photoelectric conversion device 304 is the photoelectric conversion device 100 described in either of the first and second exemplary embodiments. The photoelectric conversion device 304 has a function of generating a distance signal indicating the distance to the object 330 based on the image light from the object 330 and supplying the generated distance signal to the image processing circuit 306.

The image processing circuit 306 has a function of performing image processing for constructing a distance image based on the distance signal supplied from the photoelectric conversion device 304.

The monitor 308 has a function of displaying the distance image (image data) obtained by the image processing of the image processing circuit 306. The memory 310 has a function of storing (recording) the distance image (image data) obtained by the image processing of the image processing circuit 306.

As describe above, according to the present exemplary embodiment, a distance image sensor capable of obtaining a distance image containing more accurate distance information can be achieved by configuring the distance image sensor using the photoelectric conversion device 100 according to either of the first and second exemplary embodiments, together with the improvement in the characteristics of the pixels 12.

Figure 14:
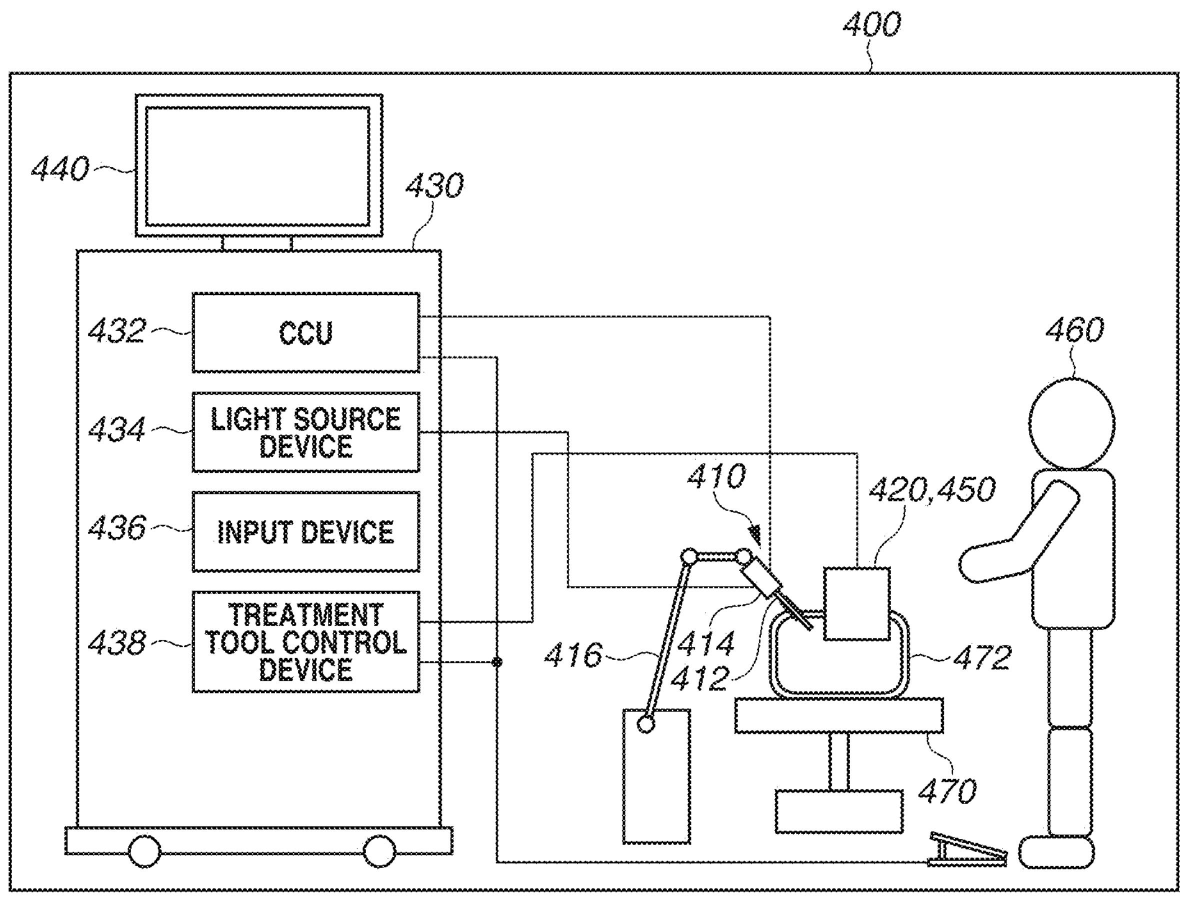
FIG. 14 is a schematic diagram illustrating a configuration example of an endoscopic surgery system according to a sixth exemplary embodiment of the present invention.

An endoscopic surgery system according to a fifth exemplary embodiment of the present invention will be described with reference to FIG. 14. FIG. 14 is a schematic diagram illustrating a configuration example of the endoscopic surgery system according to the present exemplary embodiment. In the present exemplary embodiment, the endoscopic surgery system will be described as an example of an optical detection system to which the photoelectric conversion device 100 according to either of the first and second exemplary embodiments is applied.

FIG. 14 illustrates a state where an operator (doctor) 460 is performing surgery on a patient 472 on a patient bed 470 using an endoscopic surgery system 400.

As illustrated in FIG. 14, the endoscopic surgery system 400 according to the present exemplary embodiment can include an endoscope 410, a surgical tool 420, and a cart 430 on which various devices for endoscopic surgery are mounted. A camera control unit (CCU) 432, a light source device 434, an input device 436, a treatment tool control device 438, and a display device 440 can be mounted on the cart 430.

The endoscope 410 includes a lens barrel 412 and a camera head 414. A predetermined length of the lens barrel 412 at the tip is inserted into a body cavity of the patient 472. The camera head 414 is connected to the bottom of the lens barrel 412. While FIG. 14 illustrates the endoscope 410 configured as a rigid scope with the rigid lens barrel 412, the endoscope 410 may be configured as a flexible scope with a flexible lens barrel. The endoscope 410 is movably held by an arm 416.

The tip of the lens barrel 412 has an opening with an objective lens fitted thereto. The light source device 434 is connected to the endoscope 410. Light generated by the light source device 434 is guided to the tip of the lens barrel 412 by a lightguide extended through the lens barrel 412, and emitted toward an observation target in the body cavity of the patient 472 through the objective lens. The endoscope 410 may be a forward-viewing endoscope, an oblique-viewing endoscope, or a side-viewing endoscope.

A not-illustrated optical system and photoelectric conversion device are disposed inside the camera head 414. Reflected light (observation light) from the observation target is collected to the photoelectric conversion device through the optical system. The photoelectric conversion device photoelectrically converts the observation light to generate an electrical signal corresponding to the observation light, or equivalently, an image signal corresponding to an observation image. The photoelectric conversion device 100 described in either of the first and second exemplary embodiments can be used as the photoelectric conversion device. The image signal is transmitted to the CCU 432 as raw data.

The CCU 432 includes a central processing unit (CPU) and a graphics processing unit (GPU), and controls the operation of the endoscope 410 and the display device 440 in a centralized manner. The CCU 432 receives the image signal from the camera head 414, and applies various types of image processing for displaying an image based on the image signal, such as development processing (demosaicing processing), to the image signal.

The display device 440 displays the image based on the image signal to which the image processing is applied by the CCU 432, under control of the CCU 432.

The light source device 434 includes a light source such as a light-emitting diode (LED), for example, and supplies the endoscope 410 with illumination light in capturing an image of the surgical site.

The input device 436 is an input I/F for the endoscopic surgery system 400. The user (operator) can input various types of information and instructions to the endoscopic surgery system 400 via the input device 436.

The treatment tool control device 438 controls driving of an energy treatment tool 450 for tissue cauterization, cutting, or sealing of blood vessels.

The light source device 434 that supplies the endoscope 410 with the illumination light in capturing an image of the surgical site can include a white light source including an LED, a laser light source, or a combination of these, for example. If the white light source is constituted by combining red, blue, and green (RGB) laser light sources, the white balance of the captured image can be adjusted by the light source device 434 since the output intensity and output timing of each color (wavelength) can be controlled with high precision. In such a case, images corresponding to the R, G, and B colors can be captured in a time-division manner by irradiating the observation target with the respective laser beams from the RGB laser light sources in a time-division manner and controlling the driving of the image sensor of the camera head 414 in synchronization with the irradiation timing. According to such a method, a color image can be obtained without providing color filters on the image sensor.

The driving of the light source device 434 can be controlled so that the intensity of the output light changes at predetermined time intervals. An HDR image with no underexposure or overexposure can be generated by controlling the driving of the image sensor of the camera head 414 in synchronization with the changing timing of the light intensity to obtain images in a time-division manner and combining the images.

The light source device 434 may be configured so that light in a predetermined wavelength band for special light observation can be supplied. For example, special light observation uses the wavelength dependence of light absorption by body tissues. Specifically, a high-contrast image of predetermined tissues such as blood vessels in the mucosal surface layer is captured by irradiating the mucosal surface layer with narrow-band light compared to the illumination light used in normal observation (i.e., white light). As another example of special light observation, fluorescence observation may be performed to obtain images based on fluorescence caused by excitation light irradiation. In fluorescence observation, fluorescent images can be obtained by irradiating body tissues with excitation light and observing fluorescence from the body tissues, or by locally injecting a reagent such as indocyanine green (ICG) into the body tissues and irradiating the body tissues with excitation light corresponding to the fluorescence wavelength of the reagent. The light source device 434 can be configured to be capable of supplying narrow-band light and/or excitation light for such special light observation.

As described above, according to the present exemplary embodiment, an endoscopic surgery system capable of obtaining images of higher quality can be implemented by configuring the endoscopic surgery system using the photoelectric conversion device 100 according to either of the first and second exemplary embodiments.

Sixth Embodiment

Figure 15A:
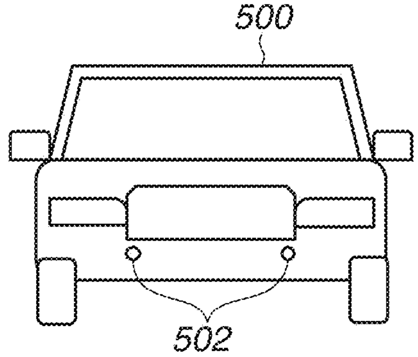
FIGS. 15A to 15C are schematic diagrams illustrating a configuration example of a moving body according to a seventh exemplary embodiment of the present invention.
Figure 15B:
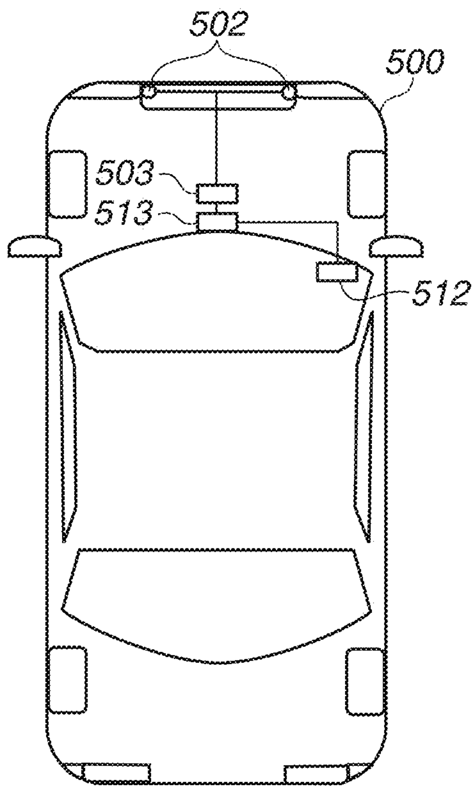
Figure 15C:
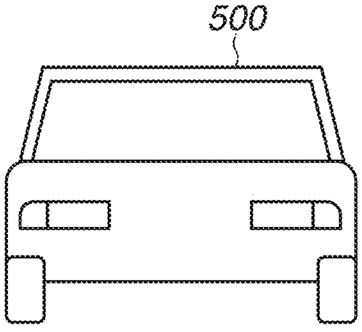
Figure 16:
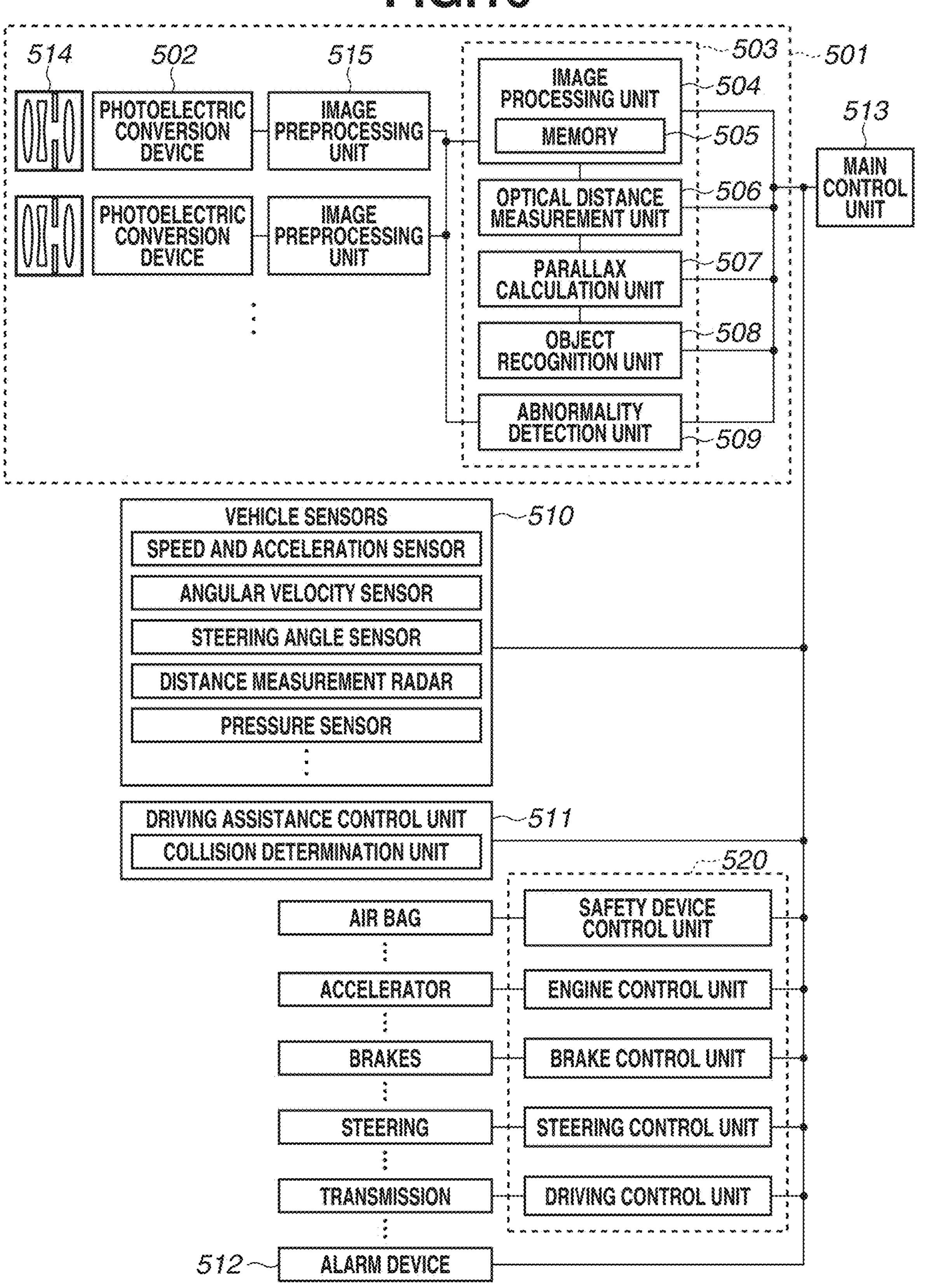
FIG. 16 is a block diagram illustrating a schematic configuration of an optical detection system according to the seventh exemplary embodiment of the present invention.
Figure 17:
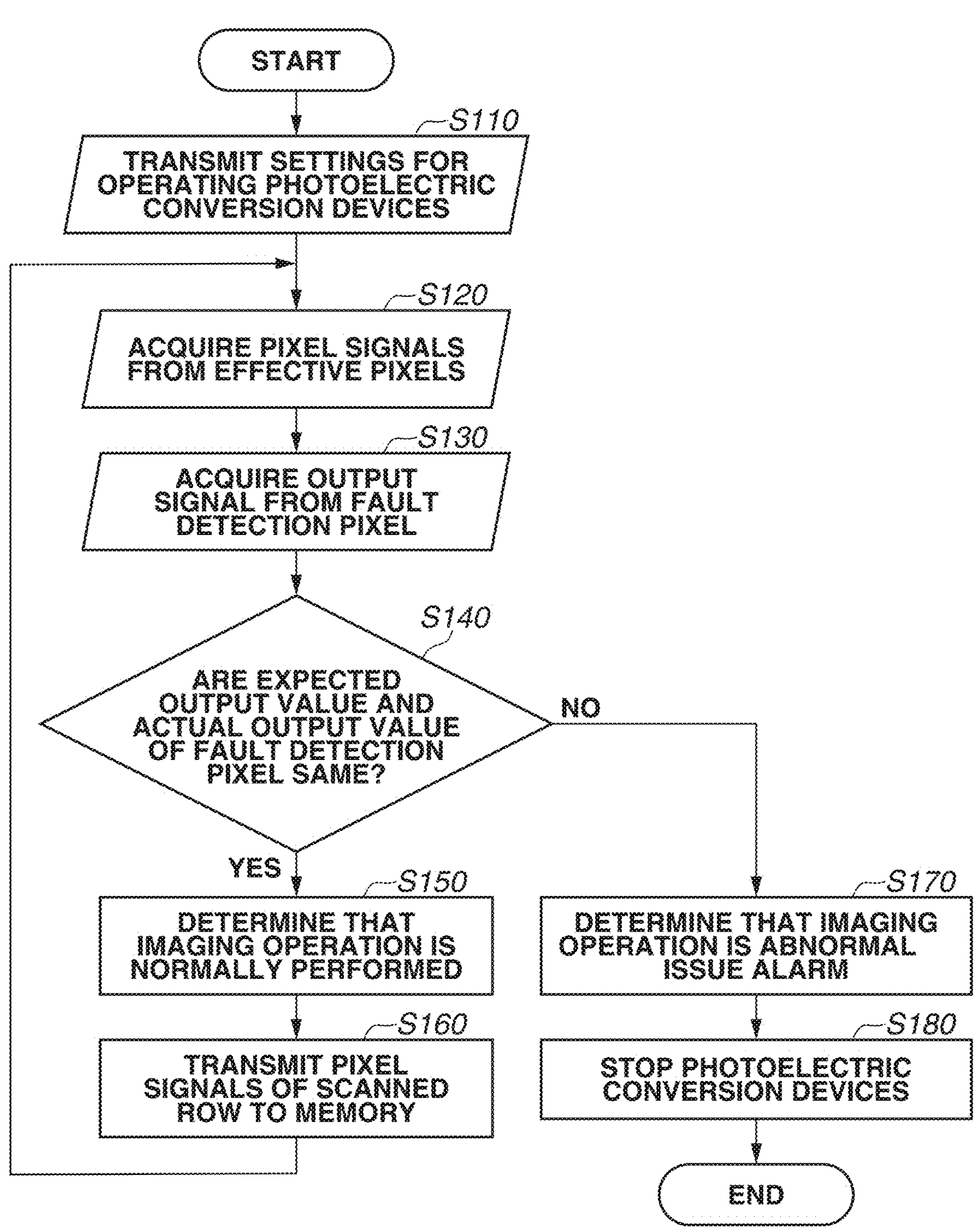
FIG. 17 is a flowchart illustrating an operation of the optical detection system according to the seventh exemplary embodiment of the present invention.

An optical detection system and a moving body according to a sixth exemplary embodiment of the present invention will be described with reference to FIGS. 15A to 17. FIGS. 15A to 15C are schematic diagrams illustrating a configuration example of the moving body according to the present exemplary embodiment. FIG. 16 is a block diagram illustrating a schematic configuration of the optical detection system according to the present exemplary embodiment. FIG. 17 is a flowchart illustrating an operation of the optical detection system according to the present exemplary embodiment. In the present exemplary embodiment, an on-vehicle camera will be described as an example of application of an optical detection system to which the photoelectric conversion device 100 according to either of the first and second exemplary embodiments is applied.

FIGS. 15A to 15C are schematic diagrams illustrating the configuration example of the moving body (vehicle system) according to the present exemplary embodiment. FIGS. 15A to 15C illustrate a configuration of a vehicle 500 (automobile) as an example of the vehicle system incorporating the optical detection system to which the photoelectric conversion device 100 according to either of the first and second exemplary embodiments is applied. FIG. 15A is a schematic front view of the vehicle 500. FIG. 15B is a schematic plan view of the vehicle 500. FIG. 15C is a schematic rear view of the vehicle 500. The vehicle 500 includes a pair of photoelectric conversion devices 502 on the front. Each of the photoelectric conversion devices 502 is the photoelectric conversion device 100 described in either of the first and exemplary embodiments. The vehicle 500 also includes an integrated circuit 503, an alarm device 512, and a main control unit 513.

FIG. 16 is a block diagram illustrating a configuration example of an optical detection system 501 mounted on the vehicle 500. The optical detection system 501 includes the photoelectric conversion devices 502, image preprocessing units 515, the integrated circuit 503, and optical systems 514. Each of the photoelectric conversion devices 502 is the photoelectric conversion device 100 described in either of the first and second exemplary embodiments. The optical systems 514 form optical images of an object on the photoelectric conversion devices 502. The photoelectric conversion devices 502 convert the optical images of the object formed by the optical systems 514 into electrical signals. The image preprocessing units 515 perform predetermined signal processing on the signals output from the photoelectric conversion devices 502. The functions of the image preprocessing units 515 may be incorporated into the photoelectric conversion devices 502. The optical detection system 501 include at least two sets of an optical system 514, a photoelectric conversion device 502, and an image preprocessing unit 515. The output of the image preprocessing unit 515 in each set is input to the integrated circuit 503.

The integrated circuit 503 is one for imaging system applications, and includes an image processing unit 504, an optical distance measurement unit 506, a parallax calculation unit 507, an object recognition unit 508, and an abnormality detection unit 509. The image processing unit 504 processes image signals output from the image preprocessing units 515. For example, the image processing unit 504 performs image processing such as development processing and defect correction on the output signals of the image preprocessing units 515. The image processing unit 504 includes a memory 505 for temporarily storing the image signals. The memory 505 can store the positions of known defective pixels in the photoelectric conversion devices 502, for example.

The optical distance measurement unit 506 performs focusing and distance measurement on the object. The parallax calculation unit 507 calculates distance measurement information (distance information) from a plurality of pieces of image data (parallax images) obtained by the plurality of photoelectric conversion devices 502. Each of the photoelectric conversion devices 502 may include a configuration capable of obtaining various types of information such as distance information. The object recognition unit 508 recognizes objects such as cars, roads, road signs, and people. If an abnormality of the photoelectric conversion devices 502 is detected, the abnormality detection unit 509 notifies the main control unit 513 of the abnormality.

The integrated circuit 503 may be implemented by dedicatedly designed hardware, by software modules, or by a combination of these. A field programmable gate array (FPGA) or an application specific integrated circuit (ASIC) may be used for implementation. The integrated circuit 503 may be implemented by a combination of these.

The main control unit 513 supervises and controls the operation of the optical detection system 501, vehicle sensors 510, and control units 520. The vehicle 500 does not necessarily need to include the main control unit 513. In such a case, the photoelectric conversion devices 502, the vehicle sensors 510, and the control units 520 transmit and receive control signals via a communication network. For example, a control area network (CAN) standard can be applied to the transmission and reception of the control signals.

The integrated circuit 503 has a function of transmitting control signals and setting values to the photoelectric conversion devices 502 by receiving control signals from the main control unit 513 or on the initiative of its own control unit.

The optical detection system 501 is connected to the vehicle sensors 510, and can detect the vehicle's own driving state such as a vehicle speed, yaw rate, and steering angle, as well as the environment outside the vehicle and the state of other vehicles and obstacles. The vehicle sensors 510 also serve as a distance information acquisition unit for acquiring distance information about a target object. Moreover, the optical detection system 501 is connected to a driving assistance control unit 511 that performs various types of driving assistance such as automatic steering, automatic cruising, and collision avoidance functions. In particular, as a collision determination function, the driving assistance control unit 511 estimates a collision and determines the presence or absence of a collision with other vehicles and obstacles based on the detection results of the optical detection system 501 and the vehicle sensors 510. The driving assistance control unit 511 thereby performs avoidance control when a collision is estimated, or activates safety devices in the event of a collision.

The optical detection system 501 is also connected to the alarm device 512 that issues an alarm to the driver based on the determination result of the collision determination unit. For example, if the determination result of the collision determination unit indicates a high possibility of a collision, the main control unit 513 performs vehicle control to avoid the collision or reduce the damage by applying the brakes, releasing the accelerator, and/or reducing the engine output. The alarm device 512 warns the user by sounding an alarm, displaying alarm information on the screen of a display unit such as a car navigation system and a meter panel, and/or vibrating the seat belt or the steering wheel.

In the present exemplary embodiment, the optical detection system 501 captures images of the surroundings of the vehicle 500, such as the front or rear. FIG. 15B illustrates a layout example of the optical detection system 501 in a case where the optical detection system 501 captures images in front of the vehicle.

As described above, the photoelectric conversion devices 502 are disposed on the front of the vehicle 500. Specifically, to obtain distance information between the vehicle 500 and a target object and determine the possibility of a collision, the two photoelectric conversion devices 502 are desirably symmetrically arranged about an axis of symmetry, with the centerline of the vehicle 500 in the forward-backward direction or with respect to the outer shape thereof (for example, vehicle width) as the axis of symmetry. The photoelectric conversion devices 502 are also desirably located to not obstruct the driver's field of view when the driver visually observes the conditions outside the vehicle 500 from the driver's seat. The alarm device 512 is desirably located at a position easily visible to the driver.

Next, a fault detection operation of the photoelectric conversion devices 502 in the optical detection system 501 will be described with reference to FIG. 17. The fault detection operation of the photoelectric conversion devices 502 can be performed based on steps S110 to S180 illustrated in FIG. 17.

Step S110 is a step for making startup settings of the photoelectric conversion devices 502. Specifically, settings for operating the photoelectric conversion devices 502 are transmitted from outside the optical detection system 501 (for example, the main control unit 513) or inside the optical detection system 501 to start an imaging operation and the fault detection operation of the photoelectric conversion devices 502.

In step S120, pixels signals are acquired from effective pixels. In step S130, an output value from a fault detection pixel provided for fault detection purposes is acquired. The fault detection pixel includes a photoelectric conversion element like the effective pixels. A predetermined voltage is written to this photoelectric conversion element. The fault detection pixel outputs a signal corresponding to the voltage written to the photoelectric conversion element. Steps S120 and S130 may be performed in reverse order.

In step S140, whether an expected output value of the fault detection pixel and the actual output value of the fault detection pixel are the same is determined. If the expected output value and the actual output value are determined to be the same in step S140 (YES in step S140), the processing proceeds to step S150. In step S150, the imaging operation is determined to be normally performed. The processing proceeds to step S160. In step S160, the pixel signals of the scanned row are transmitted to and temporarily stored in the memory 505. The processing then returns to step S120 to continue the faut detection operation. On the other hand, if the expected output value and the actual output value are determined to not be the same in step S140 (NO in step S140), the processing proceeds to step S170. In step S170, the imaging operation is determined to be abnormal, and an alarm is issued to the main control unit 513 or the alarm device 512. The alarm device 512 displays the detection of the abnormality on the display unit. In step S180, the photoelectric conversion devices 502 are stopped, and the operation of the optical detection system 501 ends.

In the present exemplary embodiment, the flowchart is described to loop row by row. However, the flowchart may loop in units of several rows. The fault detection operation may be performed frame by frame. The alarm in step S170 may be issued and notified to outside the vehicle 500 via a wireless network.

While the present exemplary embodiment has dealt with a control to avoid a collision with other vehicles, the optical detection system 501 is also applicable to automatic driving control to follow another vehicle or automatic driving control to stay in the lane. Moreover, the optical detection system 501 is not limited to vehicles such as the own vehicle, and can be applied to moving bodies (moving apparatuses) such as a ship, an aircraft, and an industrial robot, for example. Furthermore, the optical detection system 501 is not limited to a moving body, either, and can be widely applied to devices using object recognition, such as an intelligent transportation system (ITS).

Seventh Embodiment

Figure 18A:
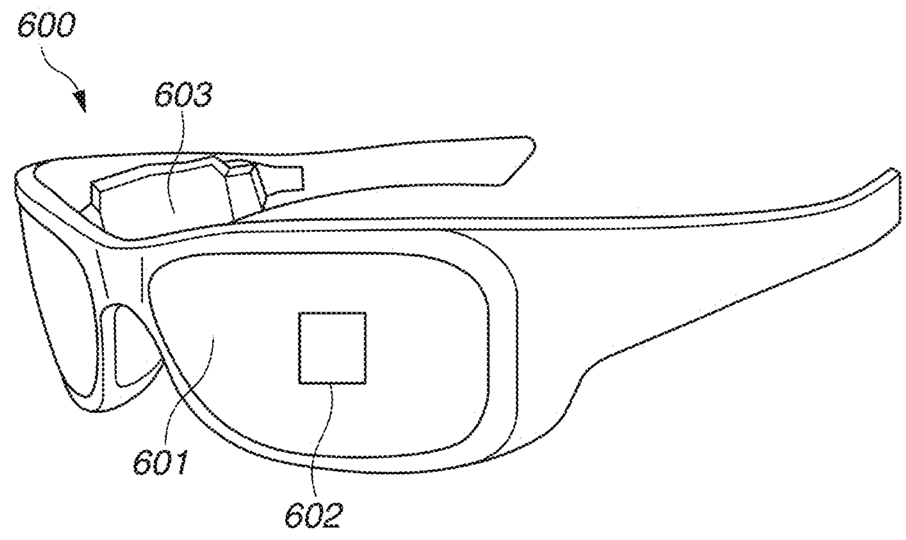
FIGS. 18A and 18B schematic diagrams illustrating schematic configurations of an optical detection system according to an eighth exemplary embodiment of the present invention.
Figure 18B:
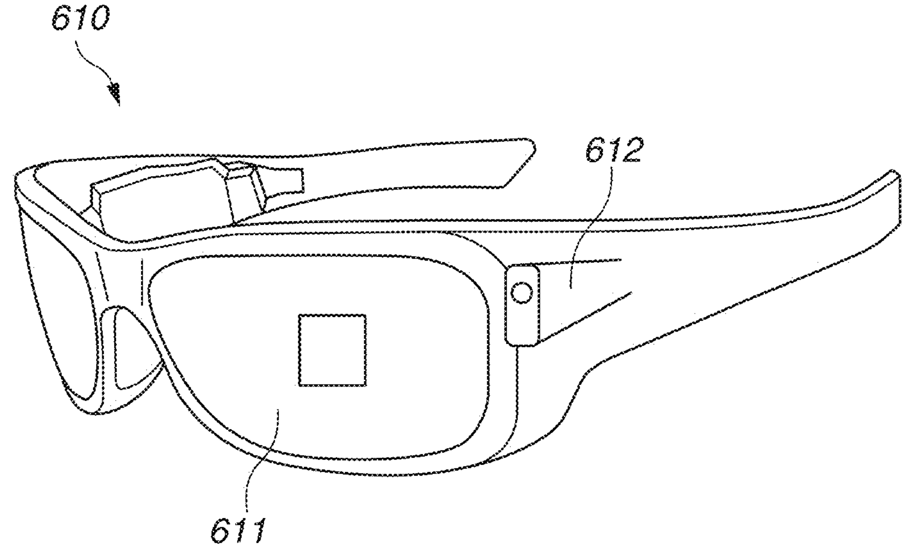

An optical detection system according to a seventh exemplary embodiment of the present invention will be described with reference to FIGS. 18A and 18B. FIGS. 18A and 18B are schematic diagrams illustrating configuration examples of the optical detection system according to the present exemplary embodiment. In the present exemplary embodiment, glasses (smart glasses) will be described as application examples of an optical detection system to which the photoelectric conversion device 100 according to either of the first and second exemplary embodiments is applied.

FIG. 18A illustrates glasses 600 (smart glasses) according to an application example. The glasses 600 include lenses 601, a photoelectric conversion device 602, and a control apparatus 603.

The photoelectric conversion device 602 is the photoelectric conversion device 100 described in either of the first and second exemplary embodiments, and disposed on a lens 601. There may be one or more photoelectric conversion devices 602. If a plurality of photoelectric conversion devices 602 is used, a plurality of types of photoelectric conversion devices 602 may be used in combination. The position of the photoelectric conversion device 602 is not limited to that illustrated in FIG. 18A. A display device (not illustrated) including a light emission device such as an organic light-emitting diode (OLED) and an LED may be disposed on the backside of the lens 601.

The control apparatus 603 functions as a power supply for supplying power to the photoelectric conversion device 602 and the foregoing display device. The control apparatus 603 also has a function of controlling the operation of the photoelectric conversion device 602 and the display device. The lens 601 includes an optical system for collecting light to the photoelectric conversion device 602.

FIG. 18B illustrates glasses 610 (smart glasses) according to another application example. The glasses 610 includes lenses 611 and a control apparatus 612. The control apparatus 612 can include a not-illustrated photoelectric conversion device corresponding to the photoelectric conversion device 602 and a not-illustrated display device.

A lens 611 is equipped with the photoelectric conversion device in the control apparatus 612 and an optical system for projecting light from the display device, whereby an image is projected on the lens 611. The control apparatus 612 functions as a power supply for supplying power to the photoelectric conversion device and the display device, and also has a function of controlling the operation of the photoelectric conversion device and the display device.

The control apparatus 612 may further include a line of sight detection unit that detects the line of sight of the wearer. In such a case, the control apparatus 612 may include an infrared light emission unit, and infrared rays emitted from the infrared light emission unit can be used to detect the line of sight. Specifically, the infrared light emission unit emits infrared rays toward the user's eyeball gazing at a displayed image. An imaging unit including a light receiving element detects reflection of the emitted infrared rays from the eyeball, whereby a captured image of the eyeball can be obtained. A drop in image quality can be reduced by providing a reduction unit configured to reduce light from the infrared light emission unit to the display unit in a plan view.

The user's line of sight to the displayed image can be detected from the captured image of the eyeball obtained by infrared imaging. Any conventional technique can be applied to the line of sight detection using the captured image of the eyeball. For example, a line of sight detection method based on a Purkinje image formed by the reflection of the illumination light on the cornea can be used. More specifically, line of sight detection processing based on the pupil-cornea reflection method is performed. The user's line of sight is detected by calculating a line of sight vector indicating the direction (rotation angle) of the eyeball based on the pupil image and the Purkinje image included in the captured image of the eyeball, using the pupil-cornea reflection method.

The display device according to the present exemplary embodiment may include a photoelectric conversion device including a light receiving element and be configured to control the displayed image based on the user's line of sight information from the photoelectric conversion device. Specifically, the display device determines a first field of view region at which the user is gazing and a second field of view region other than the first field of view region, based on the line of sight information. The first field of view region and the second field of view region may be determined by a control apparatus of the display device or by an external control apparatus. If the external control apparatus determines the field of view regions, the determination results are conveyed to the display device via communication. The display resolution of the first field of view region on the display area of the display device may be controlled to be higher than that of the second field of view region. In other words, the second field of view region may have a resolution lower than that of the first field of view region.

The display area may include a first display region and a second display region different from the first display region, and a region of higher priority may be determined between the first and second display regions based on the line of sight information. The first and second display regions may be determined by the control apparatus of the display device or by an external control apparatus. If the external control apparatus determines the display regions, the determination results are conveyed to the display device via communication. The resolution of the region of higher priority may be controlled to be higher than that of the region other than the region of higher priority. In other words, the region of relatively low priority may have a low resolution.

The first field of view region or the region of higher priority may be determined using artificial intelligence (AI). The AI may be a model that is configured to estimate the angle of the line of sight and the distance to an object in front of the line of sight from the eyeball image, with eyeball images and the actual viewing directions of the eyeballs in the images as training data. Such an AI program may be included in the display device, the photoelectric conversion device, or an external apparatus. If the external apparatus includes the AI program, the estimation results are transmitted to the display device via communication.

If display control is performed based on visual detection, smart glasses further including a photoelectric conversion device for capturing the outside can be suitably applied. The smart glasses can display the captured external information in real time.

Modified Exemplary Embodiments

The present invention is not limited to the foregoing exemplary embodiments, and various modifications can be made thereto.

For example, exemplary embodiments of the present invention also include examples where some of the components of one of the foregoing exemplary embodiments are added to another exemplary embodiment or replaced with some of the components of another exemplary embodiment.

In the foregoing first exemplary embodiment, the signal is described to be output from the connection node between the cathode of the photon detection element 22 and the quenching element 24. However, the configuration of the photoelectric conversion unit 20 is not limited thereto. For example, the quenching element 24 may be connected to the anode of the photon detection element 22, and the signal may be output from the connection node between the anode of the photon detection element 22 and the quenching element 24.

Transistors or other switches may be disposed between the photon detection element 22 and the quenching element 24 and/or between the photoelectric conversion unit 20 and the pixel signal processing unit 30 to control the electrical connection between such components. Transistors or other switches may be disposed between the node to which the voltage VH is supplied and the quenching element 24 and/or between the node to which the voltage VL is supplied and the photon detection element 22 to control the electrical connection between such components.

In the foregoing first exemplary embodiment, the counter 34 is described as an example of the processing circuit 34. However, the processing circuit 34 may be constituted by a time-to-digital converter (TDC) and a memory. In such a case, the generation timing of the pulse signal output from the waveform shaping circuit 32 is converted into a digital signal by the TDC. In measuring the timing of the pulse signal, a control pulse pREF (reference signal) is supplied from the vertical scanning circuit unit 40 to the TDC via the control line 14. With reference to the control pulse pREF, the TDC obtains a digital signal indicating the input timing of the signal output from each pixel 12 in terms of a relative time.

The foregoing exemplary embodiments are merely examples of embodiment for carrying out the present invention, and should not be construed as limiting the technical scope of the present invention. In other words, the present invention can be carried out in various forms without departing from the technical concept or main features thereof.

The present invention is not limited to the foregoing exemplary embodiments, and various changes and modifications can be made without departing from the sprit or scope of the present invention. The following claims are therefore appended to make the scope of the present invention public.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

According to an exemplary embodiment of the present invention, a photoelectric conversion device can be enhanced in functionality and recued in power consumption.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. A photoelectric conversion device comprising:

a plurality of pixels each including
- a photoelectric conversion unit configured to output a signal based on incidence of a photon, the photoelectric conversion unit including an avalanche photodiode configured to multiply a charge resulting from the incidence of the photon by avalanche multiplication,
- a counter configured to count the signal output from the photoelectric conversion unit, and
- a pixel output circuit configured to control output of a count counted by the counter;

a data line connected to the plurality of pixels; and a reception circuit configured to receive a pixel signal output from the plurality of pixels via the data line, wherein an off-leakage current of a first transistor constituting the reception circuit is lower than that of a second transistor constituting the pixel output circuit, wherein the photoelectric conversion device is configured to record time information about when the count of the counter reaches a predetermined value, and wherein the photoelectric conversion device further comprises an acquisition unit configured to acquire a predicted count based on the time information.

2. The photoelectric conversion device according to claim 1, wherein a threshold voltage of the first transistor has an absolute value greater than that of a threshold voltage of the second transistor.

3. The photoelectric conversion device according to claim 1, wherein an off-leakage current of a third transistor constituting the counter is lower than that of the second transistor constituting the pixel output circuit.

4. The photoelectric conversion device according to claim 3, wherein a threshold voltage of the third transistor has an absolute value greater than that of a threshold voltage of the second transistor.

5. The photoelectric conversion device according to claim 1, wherein the pixel output circuit is an open-drain buffer circuit.

6. The photoelectric conversion device according to claim 5, wherein each of the first and second transistors constitutes a part of an electrical path extending from a power supply voltage node to a reference voltage node via the data line.

7. The photoelectric conversion device according to claim 5, wherein the data line includes a pair of signal lines configured to output a non-inverted signal and an inverted signal of the pixel signal.

8. The photoelectric conversion device according to claim 1, wherein the pixel output circuit is a buffer circuit.

9. The photoelectric conversion device according to claim 1, wherein the first transistor has a gate width greater than that of the second transistor.

10. The photoelectric conversion device according to claim 1, wherein the reception circuit includes a reset circuit configured to reset a voltage of the data line.

11. The photoelectric conversion device according to claim 1, wherein the reception circuit includes a determination circuit configured to determine a signal level of the data line.

12. The photoelectric conversion device according to claim 1, wherein the pixel output circuit is configured to, if the count reaches the predetermined value, control output of the time information.

13. The photoelectric conversion device according to claim 1, further comprising a first substrate where the avalanche diode is disposed and a second substrate where the counter, the pixel output circuit, and the reception circuit are disposed, the first and second substrates being stacked on each other.

14. An optical detection system comprising:

the photoelectric conversion device according to claim 1; and a signal processing apparatus configured to process a signal output from the photoelectric conversion device.

15. The optical detection system according to claim 14, wherein the signal processing apparatus is configured to generate a distance image indicating distance information about an object based on the signal.

16. A moving body comprising:

the photoelectric conversion device according to claim 1;

a distance information acquisition unit configured to acquire distance information about an object from a parallax image based on a signal output from the photoelectric conversion device; and a control unit configured to control the moving body based on the distance information.

17. An optical detection system comprising:

a photoelectric conversion device comprising a plurality of pixels each including a photoelectric conversion unit configured to output a signal based on incidence of a photon, the photoelectric conversion unit including an avalanche photodiode configured to multiply a charge resulting from the incidence of the photon by avalanche multiplication, a counter configured to count the signal output from the photoelectric conversion unit, and a pixel output circuit configured to control output of a count counted by the counter;

a data line connected to the plurality of pixels; and a reception circuit configured to receive a pixel signal output from the plurality of pixels via the data line, wherein an off-leakage current of a first transistor constituting the reception circuit is lower than that of a second transistor constituting the pixel output circuit, wherein the photoelectric conversion device is configured to record time information about when the count of the counter reaches a predetermined value, and wherein the optical detection system further includes an acquisition apparatus configured to acquire a predicted count based on the time information.

* * * * *